(12) United States Patent
Nagata

(10) Patent No.: US 6,366,228 B2
(45) Date of Patent: Apr. 2, 2002

(54) SELECTING CIRCUIT, DIGITAL/ANALOG CONVERTER AND ANALOG/DIGITAL CONVERTER

(75) Inventor: Mitsuru Nagata, Naka-gun (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/817,044

(22) Filed: Mar. 27, 2001

(30) Foreign Application Priority Data

Mar. 28, 2000 (JP) ....................................... 2000-088411

(51) Int. Cl.[7] ............................................... H03M 1/66
(52) U.S. Cl. ........................ 341/144; 341/141; 341/150; 341/154; 341/155; 341/143; 341/118; 341/120; 341/153
(58) Field of Search ................................ 341/144, 141, 341/153, 118, 120, 150, 155, 154, 143

(56) References Cited

U.S. PATENT DOCUMENTS

| 4,703,310 A | * | 10/1987 | Van De Plassche | ......... 341/144 |
|---|---|---|---|---|
| 4,791,406 A | * | 12/1988 | Mehrgardt et al. | .......... 341/144 |
| 4,864,215 A | * | 9/1989 | Schouwenaars et al. | .... 341/144 |
| 4,935,741 A | * | 6/1990 | Reich | .......................... 341/144 |
| 5,138,317 A | | 8/1992 | Story | .......................... 341/144 |
| 5,404,142 A | | 4/1995 | Adams et al. | ............... 341/144 |
| 5,539,403 A | | 7/1996 | Tani et al. | ................... 341/144 |

* cited by examiner

*Primary Examiner*—Michael Tokar
*Assistant Examiner*—Lam T. Mai
(74) *Attorney, Agent, or Firm*—Oblon, Spivak, McClelland, Maier & Neustadt, P.C.

(57) ABSTRACT

A pair of internal signals are generated by halving a 3-bit 5-valued input signal, neglecting the least significant bit LSB. If the input signal shows the value of an odd number, 1 is added to either of the pair of internal signals to generate first and second signals. "1" is added to either of the pair of internal signals in an alternating way each time an input signal having the value of an odd number. Signal processing circuits selects a number of output terminals corresponding to the value of the first signal or the second signal out of a plurality of output terminals. All the output terminals are selected with a same probability.

21 Claims, 11 Drawing Sheets

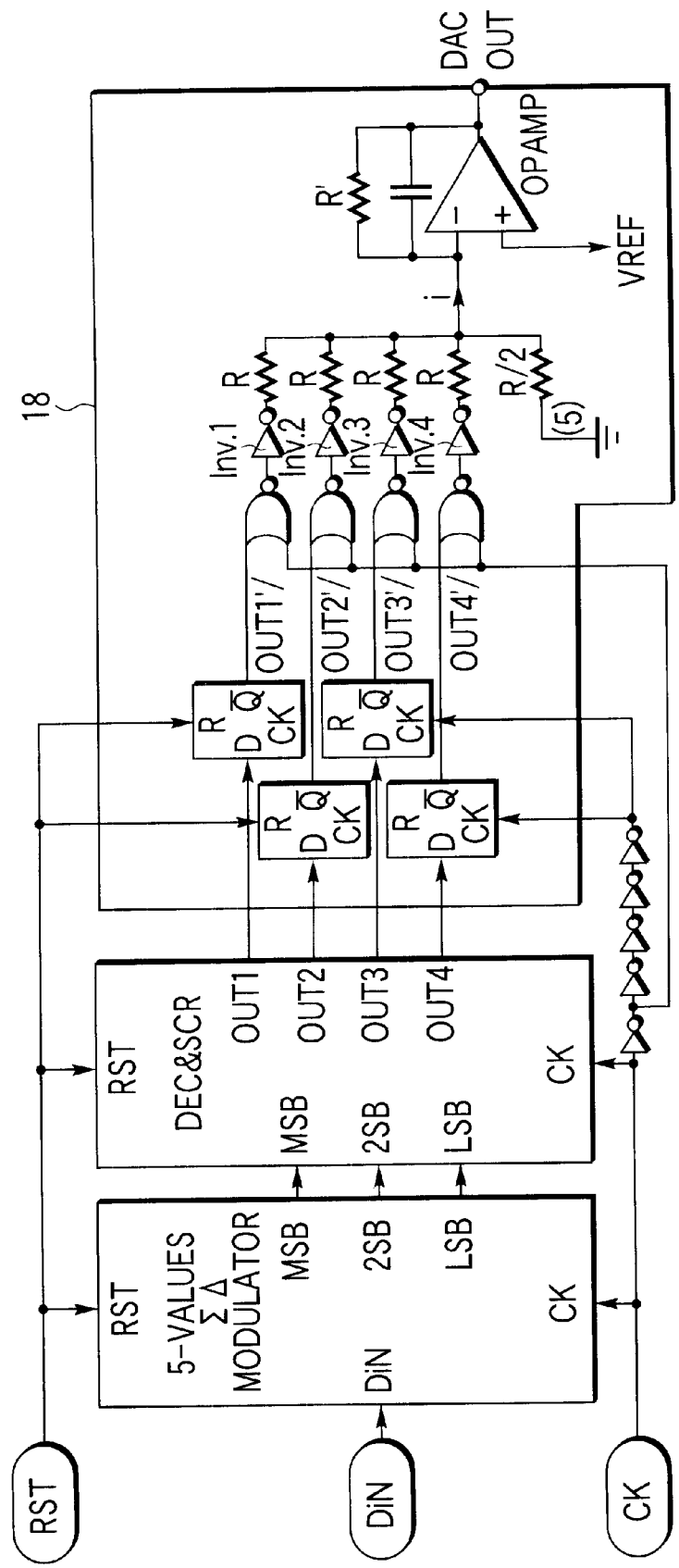
F I G. 6

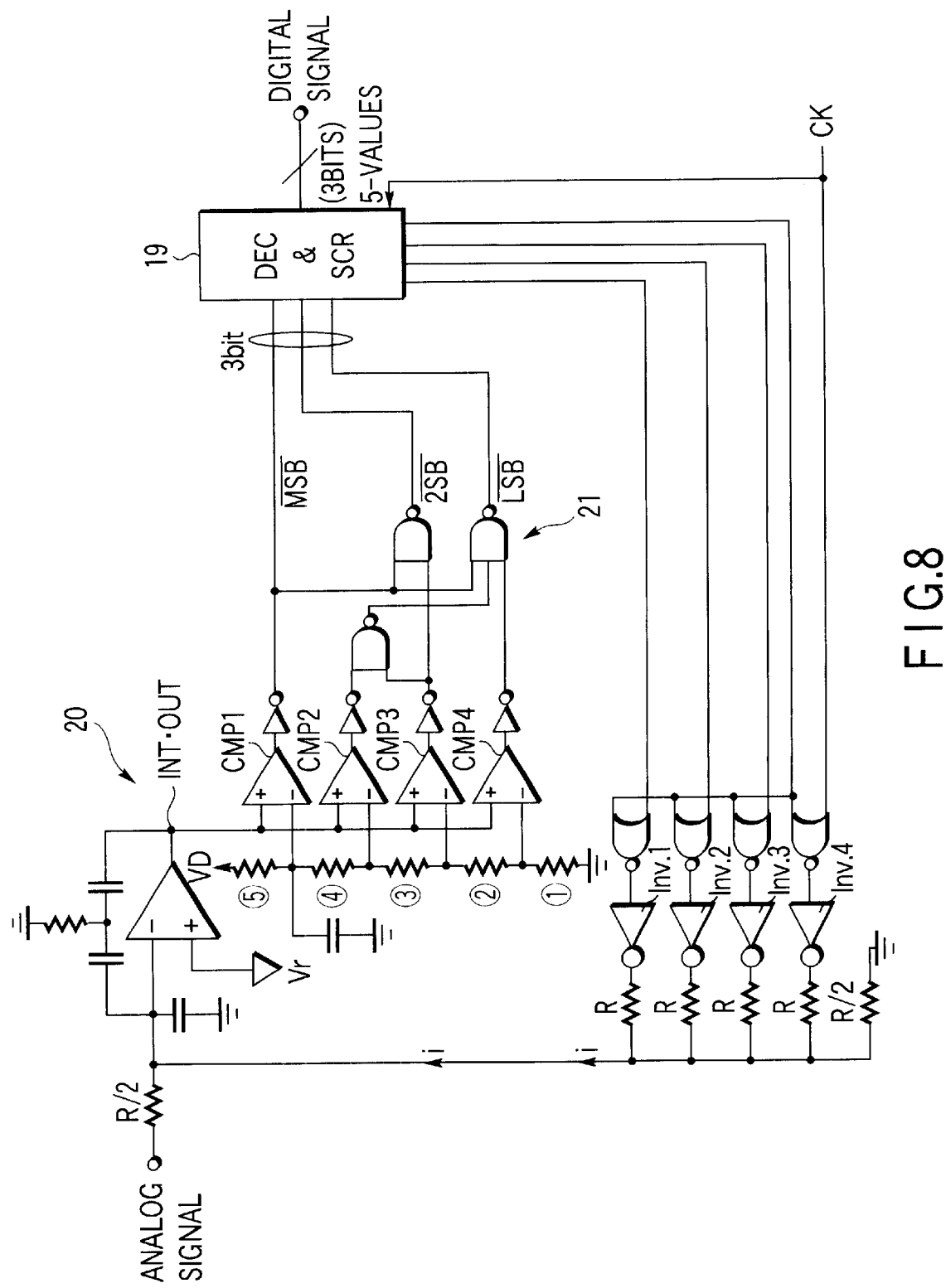
F I G. 8

SELECTING CIRCUIT, DIGITAL/ANALOG CONVERTER AND ANALOG/DIGITAL CONVERTER

CROSS-REFERENCE TO RELATED APPLICATIONS

This application is based upon and claims the benefit of priority from the prior Japanese Patent Application No. 2000-088411, filed Mar. 28, 2000, the entire contents of which are incorporated herein by reference.

BACKGROUND OF THE INVENTION

This invention relates to a selecting circuit. More particularly, the present invention relates to a selecting circuit to be used for selecting CMOS inverters or constant-current sources in a D/A (digital/analog) converter or an A/D (analog/digital) converter.

Firstly, a D/A converter disclosed in U.S. Pat. No. 5,138,317 will be described as a known D/A converter.

Referring to FIG. 1 of the accompanying drawings, a D/A converter described in the above patent document is adapted to thermometer-decode an n (positive integer)-bit digital data into $2^n$ data (Step A) and convert the $2^n$ data obtained by the thermometer-decoding into $2^n$ data by DWA (data weighted averaging)-decoding (Step B) on the basis of a rearrangement algorithm circuit. Then, the $2^n$ data obtained by the DWA-decoding is used to select CMOS inverters or constant-current sources (Step C).

The DWA-decoding operation is carried out by a selecting circuit (rearrangement algorithm circuit). The selecting circuit selects CMOS inverters or constant-current sources on the basis of a rearrangement algorithm. More specifically, the selecting circuit thermometer-decodes the n-bit data to generate a $2^n$-valued data ($2^n-1 \geq m \geq 0$) and rearranges the $2^n$-valued data (by DWA-decoding) on the basis of the rearrangement algorithm so that it selects a total of m CMOS inverters or constant-current sources that are controlled by the selected m lines on the basis of the $2^n$-valued data. Then, the electric currents of the selected constant-current sources (i) are added (m×i) and the obtained result is converted into a voltage by an I-V converter circuit to produce the desired analog data.

Now, methods that can be used for selecting CMOS inverters or constant-current sources will be discussed below.

The technique of thermometer-decoding as shown in Table 1 (3 bits→5 values) and Table 2 (3 bits→7 values) is known for selecting CMOS inverters or constant-current sources. This technique is characterized in that a predetermined number of constant-current sources are selected from a side of plurality of constant-current sources that are always arranged side by side like a thermometer for each data conversion.

TABLE 1

| 5-Values output signal | DATA | Thermometer Cording Selected: o | | | |
|---|---|---|---|---|---|
| | | 1 | 2 | 3 | 4 |
| +2 | 4 | o | o | o | o |
| −1 | 1 | o | ● | ● | ● |
| 0 | 2 | o | o | ● | ● |
| +1 | 3 | o | o | o | ● |

TABLE 1-continued

| 5-Values output signal | DATA | Thermometer Cording Selected: o | | | |
|---|---|---|---|---|---|
| | | 1 | 2 | 3 | 4 |
| +2 | 4 | o | o | o | o |
| −1 | 1 | o | ● | ● | ● |
| −2 | 0 | ● | ● | ● | ● |
| 0 | 2 | o | o | ● | ● |
| +1 | 3 | o | o | o | ● |
| 0 | 2 | o | o | ● | ● |
| −2 | 0 | ● | ● | ● | ● |
| 0 | 2 | o | o | ● | ● |
| −1 | 1 | o | ● | ● | ● |
| +2 | 4 | o | o | o | o |
| +1 | 3 | o | o | o | ● |
| −2 | 0 | ● | ● | ● | ● |
| −1 | 1 | o | ● | ● | ● |
| +1 | 3 | o | o | o | ● |
| −2 | 0 | ● | ● | ● | ● |
| 0 | 2 | o | o | ● | ● |
| −1 | 1 | o | ● | ● | ● |
| +2 | 4 | o | o | o | o |
| −2 | 0 | ● | ● | ● | ● |
| +1 | 3 | o | o | o | ● |
| −1 | 1 | o | ● | ● | ● |
| 0 | 2 | o | o | ● | ● |
| +2 | 4 | o | o | o | o |
| +1 | 3 | o | o | o | ● |
| 0 | 2 | o | o | ● | ● |

TABLE 2

| 7 Values output signal | DATA | Thermometer Cording Selected: o | | | | | |
|---|---|---|---|---|---|---|---|
| | | 1 | 2 | 3 | 4 | 5 | 6 |
| +2 | 5 | o | o | o | o | o | ● |
| −1 | 2 | o | o | ● | ● | ● | ● |
| 0 | 3 | o | o | o | ● | ● | ● |
| +1 | 4 | o | o | o | o | ● | ● |
| +3 | 6 | o | o | o | o | o | o |
| +2 | 5 | o | o | o | o | o | ● |
| −2 | 1 | o | ● | ● | ● | ● | ● |
| 0 | 3 | o | o | o | ● | ● | ● |
| +1 | 4 | o | o | o | o | ● | ● |
| −3 | 0 | ● | ● | ● | ● | ● | ● |
| −2 | 1 | o | ● | ● | ● | ● | ● |
| 0 | 3 | o | o | o | ● | ● | ● |
| −1 | 2 | o | o | ● | ● | ● | ● |
| +3 | 6 | o | o | o | o | o | o |
| +2 | 5 | o | o | o | o | o | ● |
| −2 | 1 | o | ● | ● | ● | ● | ● |
| −1 | 2 | o | o | ● | ● | ● | ● |
| +1 | 4 | o | o | o | o | ● | ● |
| −2 | 1 | o | ● | ● | ● | ● | ● |
| 0 | 3 | o | o | o | ● | ● | ● |
| −1 | 2 | o | o | ● | ● | ● | ● |
| +3 | 6 | o | o | o | o | o | o |
| −3 | 0 | ● | ● | ● | ● | ● | ● |
| +2 | 5 | o | o | o | o | o | ● |
| −1 | 2 | o | o | ● | ● | ● | ● |
| −3 | 0 | ● | ● | ● | ● | ● | ● |
| +3 | 6 | o | o | o | o | o | o |
| +2 | 5 | o | o | o | o | o | ● |
| 0 | 3 | o | o | o | ● | ● | ● |
| −3 | 0 | ● | ● | ● | ● | ● | ● |
| +1 | 4 | o | o | o | o | ● | ● |

There is also known a technique of selecting a plurality of constant-current sources with a same probability in order to noise-shaping the errors (noise) in the electric currents that are generated in a plurality of constant-current sources.

Table 3 (3 bits→5 values) and Table 4 (3 bits→7 values) show a selection method referred to as DWA-decoding (data weighted averaging-decoding).

This method is characterized in that constant-current sources are sequentially selected from a side of a plurality of constant-current sources that are arranged side by side to the other side. With this technique, as an operation of data conversion is repeated, constant-current sources are sequentially selected from a side of a plurality of constant-current sources to the other side and, when a constant-current source is selected as one closest to the extremity of the other side, one closest to the extremity of this side is selected so that the selected constant-current sources runs circularly.

TABLE 3

| 5-Values output signal | DATA | DWA Cording Selected : ○ | | | |
|---|---|---|---|---|---|
| | | 1 | 2 | 3 | 4 |
| +2 | 4 | ○ | ○ | ○ | ○ |
| −1 | 1 | ○ | ● | ● | ● |
| 0 | 2 | ● | ○ | ○ | ● |
| +1 | 3 | ○ | ○ | ● | ○ |
| +2 | 4 | ○ | ○ | ○ | ○ |
| −1 | 1 | ● | ● | ○ | ● |
| −2 | 0 | ● | ● | ● | ● |
| 0 | 2 | ○ | ● | ● | ○ |
| +1 | 3 | ● | ○ | ○ | ○ |
| 0 | 2 | ○ | ○ | ● | ● |
| −2 | 0 | ● | ● | ● | ● |
| 0 | 2 | ● | ● | ○ | ○ |
| −1 | 1 | ○ | ● | ● | ● |
| +2 | 4 | ○ | ○ | ○ | ○ |
| +1 | 3 | ● | ○ | ○ | ○ |
| −2 | 0 | ● | ● | ● | ● |
| −1 | 1 | ○ | ● | ● | ● |
| +1 | 3 | ● | ○ | ○ | ○ |
| −2 | 0 | ● | ● | ● | ● |
| 0 | 2 | ○ | ○ | ● | ● |
| −1 | 1 | ● | ● | ○ | ● |
| +2 | 4 | ○ | ○ | ○ | ○ |
| −2 | 0 | ● | ● | ● | ● |
| +1 | 3 | ○ | ○ | ● | ○ |
| −1 | 1 | ● | ● | ○ | ● |
| 0 | 2 | ○ | ● | ● | ○ |
| +2 | 4 | ○ | ○ | ○ | ○ |
| +1 | 3 | ● | ○ | ○ | ○ |
| 0 | 2 | ○ | ○ | ● | ● |

TABLE 4

| 7 Values output signal | DATA | DWA Cording Selected: ○ | | | | | |
|---|---|---|---|---|---|---|---|
| | | 1 | 2 | 3 | 4 | 5 | 6 |
| +2 | 5 | ○ | ○ | ○ | ○ | ○ | ● |
| −1 | 2 | ○ | ● | ● | ● | ● | ○ |
| 0 | 3 | ● | ○ | ○ | ○ | ● | ● |
| +1 | 4 | ○ | ○ | ● | ● | ○ | ○ |
| +3 | 6 | ○ | ○ | ○ | ○ | ○ | ○ |
| +2 | 5 | ○ | ● | ● | ● | ○ | ○ |
| −2 | 1 | ● | ○ | ● | ● | ● | ● |
| 0 | 3 | ● | ● | ○ | ○ | ○ | ● |
| +1 | 4 | ○ | ○ | ○ | ● | ● | ○ |
| −3 | 0 | ● | ● | ● | ● | ● | ● |
| −2 | 1 | ● | ● | ● | ○ | ● | ● |
| 0 | 3 | ○ | ● | ● | ● | ○ | ○ |
| −1 | 2 | ● | ○ | ○ | ● | ● | ● |
| +3 | 6 | ○ | ○ | ○ | ○ | ○ | ○ |
| +2 | 5 | ○ | ○ | ● | ○ | ○ | ○ |
| −2 | 1 | ● | ● | ○ | ● | ● | ● |

TABLE 4-continued

| 7 Values output signal | DATA | DWA Cording Selected: ○ | | | | | |
|---|---|---|---|---|---|---|---|
| | | 1 | 2 | 3 | 4 | 5 | 6 |
| −1 | 2 | ● | ● | ● | ○ | ○ | ● |
| +1 | 4 | ○ | ○ | ○ | ● | ● | ○ |
| −2 | 1 | ● | ● | ● | ○ | ● | ● |
| 0 | 3 | ○ | ● | ● | ● | ○ | ○ |
| −1 | 2 | ● | ○ | ○ | ● | ● | ● |
| +3 | 6 | ○ | ○ | ○ | ○ | ○ | ○ |
| −3 | 0 | ● | ● | ● | ● | ● | ● |
| +2 | 5 | ○ | ○ | ● | ○ | ○ | ○ |
| −1 | 2 | ● | ● | ○ | ○ | ● | ● |
| −3 | 0 | ● | ● | ● | ● | ● | ● |
| +3 | 6 | ○ | ○ | ○ | ○ | ○ | ○ |
| +2 | 5 | ○ | ○ | ○ | ● | ○ | ○ |
| 0 | 3 | ● | ● | ● | ○ | ○ | ○ |
| −3 | 0 | ● | ● | ● | ● | ● | ● |
| +1 | 4 | ○ | ○ | ○ | ○ | ● | ● |

FIG. 2 schematically illustrates a first example of D/A converter for converting a 9-valued digital signal into an analog signal. This circuit corresponds to block C of FIG. 1.

A constant-current source 2 adapted to generate an electric current of 4i is connected between a voltage source VDD node and the negative input node of operational amplifier 1. A switch 3 and a constant-current source 4 that are connected in series are connected between the negative input node of operational amplifier 1 and a grounding node. A total of 8 combinations of a switch 3 and a constant-current source 4 are provided and are connected in parallel between the negative input node of the operational amplifier 1 and the grounding node.

The switch circuits 3 are selected by the data obtained by thermometer-decoding or DWA-decoding. The input current of the operational amplifier 1 is defined by the electric current 4i of the constant-current source 2 and the total value of the electric currents i of the constant-current sources 4 that are connected respectively to the selected switch circuits 3. As a result, the operational amplifier performs an I-V conversion to produce an analog data in the form of a voltage. The error (noise) of each of the constant-current sources 4 is subjected to noise-shaping when the technique of DWA-decoding as shown in Tables 3 and 4 is used.

However, U.S. Pat. No. 5,138,317 does not disclose any circuit to be used for DWA-decoding.

Now, a D/A converter disclosed in U.S. Pat. No. 5,404,142 will be described as another known D/A converter.

U.S. Pat. No. 5,404,142 discloses a selecting circuit to be used for DWA-decoding.

The selecting circuit has a configuration as shown in FIGS. 3 and 4.

This selecting circuit can be applied to the D/A converter of FIG. 2. In other words, the D/A converter of FIG. 2 can be made to operate for DWA-decoding by controlling the switch circuit 3 of FIG. 2 by means of a predetermined rearrangement algorithm, while entering DATA 2 of FIG. 3 to the switch circuit 3 of FIG. 2. Then, for example, thermometer-decoded DATA 1 will be rearranged into DATA 2 (by DWA-decoding) by means of this known selecting circuit so that, as a result, constant-current sources 4 will be sequentially and circularly selected.

Thus, the constant-current sources 4 of FIG. 2 will be selected with a same probability and the error (noise) of each of the constant-current sources 4 will be subjected to noise-shaping.

However, it should be noted here that the selecting circuit of FIGS. 3 and 4 comprises a total of twelve switch blocks SB. Therefore, for the circuit of FIG. 2 to perform DWA-decoding operations, the twelve switch blocks SB have to be added thereto. Additionally, as shown in FIG. 4, each of the switch blocks SB comprises three D (delay) type flip-flop circuits (D-FFs), two EX-OR (exclusive OR) gate circuits and two rearrangement gate circuits.

Therefore, a D/A converter as disclosed in U.S. Pat. No. 5,404,142 is accompanied by the problem of involving a complex selecting circuit (hardware) that makes the converter very bulky.

Now, a D/A converter disclosed in U.S. Pat. No. 5,539,403 will be discussed as still another known D/A converter.

The D/A converter described in U.S. Pat. No. 5,539,403 are similar to the above described second known converter in that it is adapted to DWA-decoding. The selecting circuit of the D/A converter is characterized in that it employs a ROM for DWA-decoding. While the rearrangement algorithm is same as that of the selecting circuit of FIGS. 3 and 4, the selecting circuit of this D/A converter is more complex and more bulky than that of the second known converter because of the use of a ROM.

As discussed above, known D/A converters are accompanied by the problem of involving a large selecting circuit (hardware) and consequent high cost when adapted to noise shaping, using DWA-decoding, for achieving highly reliable D/A conversions.

BRIEF SUMMARY OF THE INVENTION

Therefore, it is an object of the present invention to provide a selecting circuit that does not involve the use of bulky hardware for achieving highly reliable D/A conversions at low cost and at a low power consumption rate. Another object of the present invention is to provide a D/A converter and an A/D converter realized by using such a selecting circuit.

According to the invention, the above objects are achieved by providing a selecting circuit comprising a logic circuit, a first signal processing circuit and a second signal processing circuit, the logic circuit being adapted to receive an n-bit (2p+1)-valued ($2^n \geq 2p \geq 2$, n and p being an integer) input signal m (m being an integer satisfying the requirement of $2p \geq m \geq 0$), generate a pair of internal signals having a value produced by halving the value obtained on the basis of the upper (n−1) bits of the input signal m, neglecting the least significant bit of the input signal m, and then, in the case of an input signal m having an odd number value, generate first and second signals by alternately adding 1 to the two internal signals for each input of signal m having an odd number value, the first signal processing circuit having p first output terminals and adapted to select a number of output terminals corresponding to the value of the first signal out of the p first output terminals on the basis of the first signal so as to make the p output terminals to be selected with a same and identical probability of selection, the second signal processing circuit having p second output terminals and adapted to select a number of output terminals corresponding to the value of the second signal out of the p second output terminals on the basis of the second signal so as to make the p output terminals to be selected with a same and identical probability of selection.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 6 is a schematic circuit diagram of a D/A converter comprising the selecting circuit of FIGS. 5A and 5B;

FIG. 8 is a schematic circuit diagram of an A/D converter comprising the selecting circuit of FIGS. 5A and 5B;

DETAILED DESCRIPTION OF THE INVENTION

A selecting circuit of the present invention will now be described below in detail with reference to the accompanying drawing.

Figure 1:
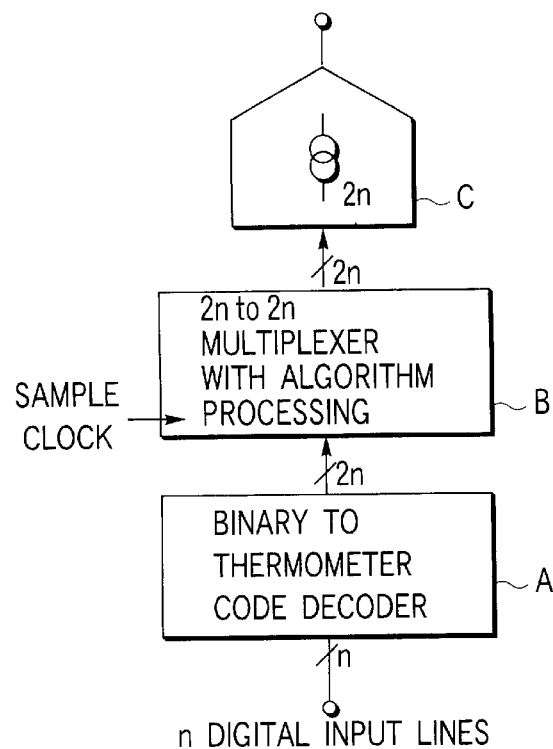
FIG. 1 is a schematic illustration of a selection method using DWA-decoding.
Figure 2:
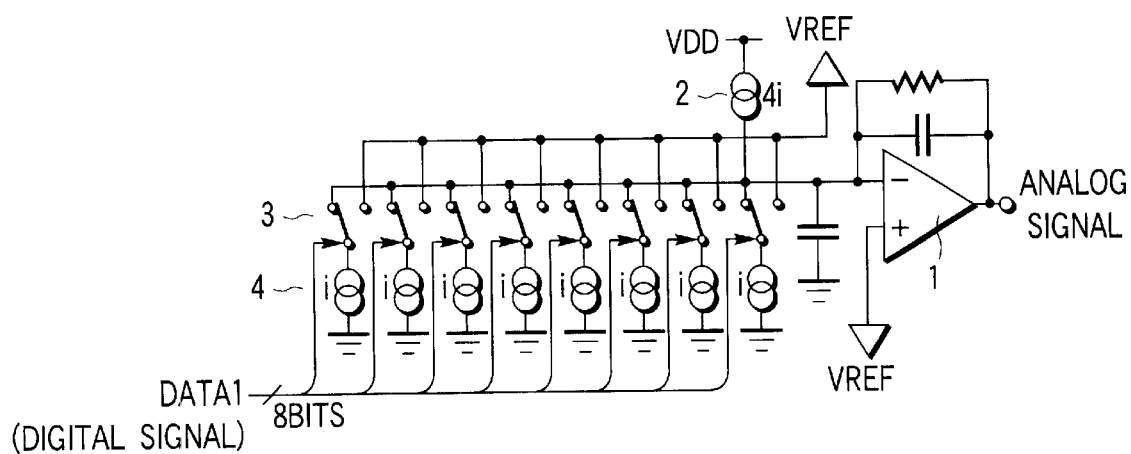
FIG. 2 is a schematic circuit diagram of a known D/A converter of the type under consideration.
Figure 3:
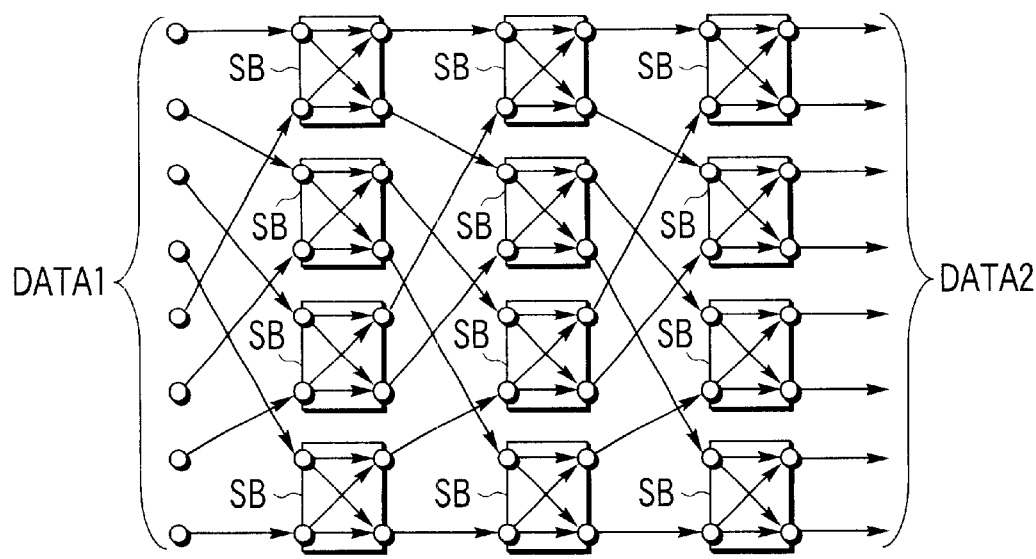
FIG. 3 is a schematic circuit diagram of a known selecting circuit.
Figure 4:
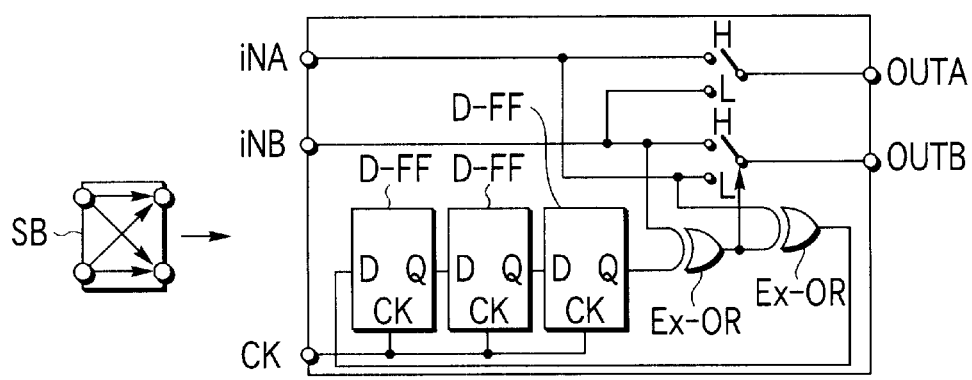
FIG. 4 is a schematic circuit diagram of a switch block SB of FIG. 3.
Figure 5:
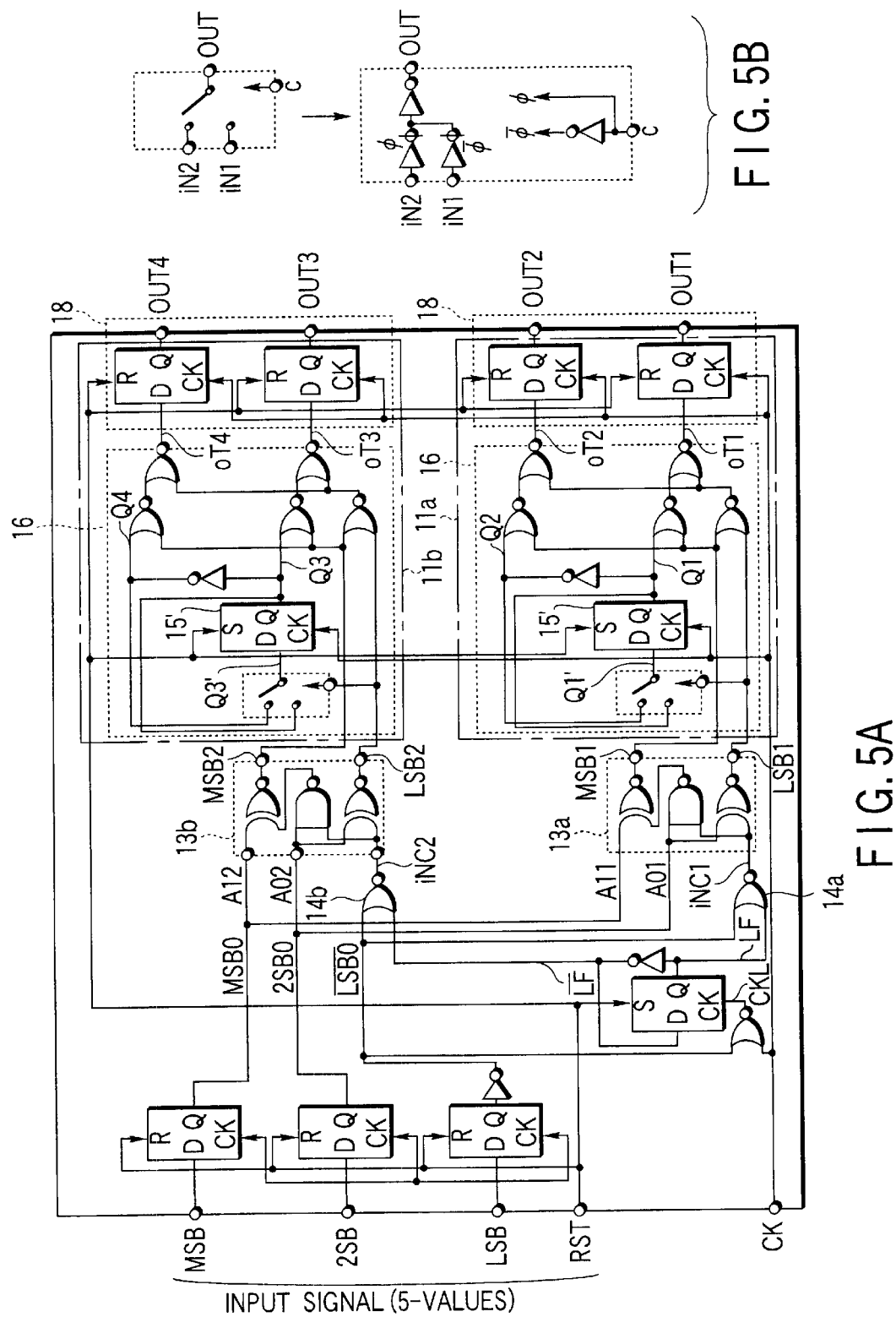
FIGS. 5A and 5B are schematic circuit diagrams of a first embodiment of selecting circuit according to the invention.

FIGS. 5A and 5B are schematic circuit diagrams of a first embodiment of selecting circuit according to the invention.

This embodiment of selecting circuit comprises a pair of data processing circuits 11a, 11b. The data processing circuit 11a is adapted to control outputs OUT1, OUT2, whereas the data processing circuit 11b is adapted to control outputs OUT3, OUT4.

5-valued input data (p=2) are used for this embodiment. Thus, the value m of the input is an integer between 0 and 4 and m is input in the form of a binary number. According to the invention, the value of the two most significant bits (MSB, 2SB) taken out of the three bit data of m is halved so as to be used by the two data processing circuits 11a, 11b.

For example, if MSB=0 and 2SB=1, the value obtained by halving the input value m (=1, or 01 in the form of 2-bit binary number), neglecting the least significant bit (LSB), is used for the input to each of the two data processing circuits 11a, 11b.

Additionally, if 1 is to be added to the value of the two most significant bits of the 3-bit data or not is determined according to the value of the LSB.

If LSB=0, the value of the two most significant bits is input to the two data processing circuits 11a, 11b as 2-bit data. This means that m is halved and the quotient is input to each of the circuits.

If, on the other hand, LSB=1, 1 is added to the 2-bit data showing the value of the two most significant bits and the sum is input to either one of the two data processing circuits 11a, 11b while the value of the two most significant bits is input to the other circuit. This means that (m+1)/2 is input to the former circuit because 1 is added to the value of the two most significant bits, whereas (m−1)/2 is input to the latter circuit because 1 is not added to the value of the two most significant bits and the LSB is neglected. The sum of the two input values is equal to m.

As pointed out above, the sum of the two values entered respectively to the two data processing circuits 11a, 11b is equal to the value of the input signal m. Then, each of the two data processing circuits 11a, 11b selects a number of output terminals that corresponds to the value input to it. As a result, a number of output terminals that corresponds to the input signal m will be selected.

Table 5 is a truth table for the sequence of operation of the selecting circuit of FIGS. 5A and 5B.

TABLE 5

| MSB | 2SB | LSB | 5-Values data | RST | MSBo | 2SBo | LSBo | CKL | LF | iNC1 | MSB1 | LSB1 | iNC2 |
|---|---|---|---|---|---|---|---|---|---|---|---|---|---|
| 1 | 0 | 0 | 4 | H → L | 0 | 0 | 0 |  | 1 | 0 | 0 | 0 | 0 |
| 0 | 0 | 1 | 1 | L | 1 | 0 | 0 |  | 1 | 0 | 1 | 0 | 0 |
| 0 | 1 | 0 | 2 | L | 0 | 0 | 1 | L → H | 1 | 0 | 0 | 0 | 1 |
| 0 | 1 | 1 | 3 | L | 0 | 1 | 0 |  | 0 | 0 | 0 | 1 | 0 |
| 1 | 0 | 0 | 4 | L | 0 | 1 | 1 | L → H | 0 | 1 | 1 | 0 | 0 |
| 0 | 0 | 1 | 1 | L | 1 | 0 | 0 |  | 1 | 0 | 1 | 0 | 0 |
| 0 | 0 | 0 | 0 | L | 0 | 0 | 1 | L → H | 1 | 0 | 0 | 0 | 1 |
| 0 | 1 | 0 | 2 | L | 0 | 0 | 0 |  | 0 | 0 | 0 | 0 | 0 |
| 0 | 1 | 1 | 3 | L | 0 | 1 | 0 |  | 0 | 0 | 0 | 1 | 0 |
| 0 | 1 | 0 | 2 | L | 0 | 1 | 1 | L → H | 0 | 1 | 1 | 0 | 0 |
| 0 | 0 | 0 | 0 | L | 0 | 1 | 0 |  | 1 | 0 | 0 | 1 | 0 |
| 0 | 1 | 0 | 2 | L | 0 | 0 | 0 |  | 1 | 0 | 0 | 0 | 0 |
| 0 | 0 | 1 | 1 | L | 0 | 1 | 0 |  | 1 | 0 | 0 | 1 | 0 |
| 1 | 0 | 0 | 4 | L | 0 | 0 | 1 | L → H | 1 | 0 | 0 | 0 | 1 |
| 0 | 1 | 1 | 3 | L | 1 | 0 | 0 |  | 0 | 0 | 1 | 0 | 0 |
| 0 | 0 | 0 | 0 | L | 0 | 1 | 1 | L → H | 0 | 1 | 1 | 0 | 0 |
| 0 | 0 | 1 | 1 | L | 0 | 0 | 0 |  | 1 | 0 | 0 | 0 | 0 |
| 0 | 1 | 1 | 3 | L | 0 | 0 | 1 | L → H | 1 | 0 | 0 | 0 | 1 |
| 0 | 0 | 0 | 0 | L | 0 | 1 | 1 | L → H | 0 | 1 | 1 | 0 | 0 |
| 0 | 1 | 0 | 2 | L | 0 | 0 | 0 |  | 1 | 0 | 0 | 0 | 0 |
| 0 | 0 | 1 | 1 | L | 0 | 1 | 0 |  | 1 | 0 | 0 | 1 | 0 |
| 1 | 0 | 0 | 4 | L | 0 | 0 | 1 | L → H | 1 | 0 | 0 | 0 | 1 |
| 0 | 0 | 0 | 0 | L | 1 | 0 | 0 |  | 0 | 0 | 1 | 0 | 0 |
| 0 | 1 | 1 | 3 | L | 0 | 0 | 0 |  | 0 | 0 | 0 | 0 | 0 |
| 0 | 0 | 1 | 1 | L | 0 | 1 | 1 | L → H | 0 | 1 | 1 | 0 | 0 |
| 0 | 1 | 0 | 2 | L | 0 | 0 | 1 | L → H | 1 | 0 | 0 | 0 | 1 |
| 1 | 0 | 0 | 4 | L | 0 | 1 | 0 |  | 0 | 0 | 0 | 1 | 0 |
| 0 | 1 | 1 | 3 | L | 1 | 0 | 0 |  | 0 | 0 | 1 | 0 | 0 |
| 0 | 1 | 0 | 2 | L | 0 | 1 | 1 | L → H | 0 | 1 | 1 | 0 | 0 |
| 1 | 0 | 0 | 4 | L | 0 | 1 | 0 |  | 1 | 0 | 0 | 1 | 0 |
| 0 | 1 | 0 | 2 | L | 0 | 0 | 0 |  | 1 | 0 | 0 | 0 | 0 |

| MSB2 | LSB2 | Q1 | Q2 | Q3 | Q4 | Q1' | Q2' | Q3' | Q4' | oT1 | oT2 | oT3 | oT4 | OUT1 | OUT2 | OUT3 | OUT4 |
|---|---|---|---|---|---|---|---|---|---|---|---|---|---|---|---|---|---|
| 0 | 0 | 1 | 0 | 1 | 0 | 1 | 0 | 1 | 0 | 0 | 0 | 0 | 0 | 0 | 0 | 0 | 0 |
| 1 | 0 | 1 | 0 | 1 | 0 | 1 | 0 | 1 | 0 | 1 | 1 | 1 | 1 | 0 | 0 | 0 | 0 |
| 0 | 1 | 1 | 0 | 1 | 0 | 1 | 0 | 0 | 1 | 0 | 0 | 1 | 0 | 1 | 1 | 1 | 1 |
| 0 | 1 | 1 | 1 | 0 | 1 | 0 | 1 | 1 | 0 | 1 | 0 | 0 | 1 | 0 | 0 | 1 | 0 |
| 0 | 1 | 0 | 1 | 1 | 0 | 0 | 1 | 0 | 1 | 1 | 1 | 0 | 1 | 0 | 0 | 0 | 1 |
| 1 | 0 | 0 | 1 | 0 | 1 | 0 | 1 | 0 | 1 | 1 | 1 | 1 | 1 | 1 | 1 | 1 | 0 |
| 0 | 1 | 0 | 1 | 0 | 1 | 1 | 1 | 0 | 0 | 0 | 0 | 1 | 1 | 1 | 1 | 1 | 1 |
| 0 | 0 | 0 | 1 | 1 | 0 | 0 | 1 | 1 | 0 | 0 | 0 | 0 | 0 | 0 | 0 | 0 | 1 |
| 0 | 1 | 0 | 1 | 1 | 0 | 1 | 0 | 0 | 1 | 0 | 1 | 1 | 0 | 0 | 0 | 0 | 0 |
| 0 | 1 | 1 | 1 | 0 | 0 | 1 | 1 | 0 | 1 | 0 | 0 | 1 | 0 | 0 | 1 | 1 | 0 |
| 0 | 1 | 0 | 1 | 0 | 0 | 1 | 0 | 1 | 1 | 0 | 1 | 0 | 1 | 1 | 1 | 0 | 1 |
| 0 | 0 | 0 | 1 | 0 | 1 | 0 | 1 | 0 | 1 | 0 | 0 | 0 | 0 | 1 | 0 | 1 | 0 |
| 0 | 1 | 0 | 1 | 0 | 1 | 1 | 0 | 1 | 0 | 0 | 1 | 0 | 1 | 0 | 0 | 0 | 0 |
| 0 | 1 | 1 | 0 | 1 | 0 | 1 | 0 | 1 | 0 | 1 | 0 | 0 | 1 | 0 | 1 | 0 | 1 |
| 1 | 0 | 1 | 0 | 0 | 1 | 1 | 0 | 0 | 1 | 1 | 1 | 1 | 0 | 0 | 0 | 1 | 0 |
| 0 | 1 | 0 | 0 | 1 | 1 | 0 | 1 | 0 | 1 | 1 | 0 | 1 | 1 | 1 | 1 | 1 | 1 |
| 0 | 0 | 1 | 0 | 1 | 0 | 1 | 0 | 0 | 0 | 0 | 0 | 1 | 1 | 0 | 1 | 0 | 1 |
| 0 | 1 | 1 | 0 | 0 | 1 | 1 | 0 | 0 | 1 | 0 | 1 | 0 | 0 | 0 | 0 | 1 | 0 |
| 0 | 0 | 1 | 0 | 1 | 0 | 1 | 0 | 1 | 0 | 0 | 0 | 0 | 1 | 1 | 0 | 0 | 1 |
| 0 | 1 | 1 | 0 | 1 | 0 | 1 | 0 | 0 | 1 | 0 | 1 | 0 | 0 | 0 | 0 | 0 | 0 |

TABLE 5-continued

| 0 | 1 | 0 | 1 | 0 | 1 | 0 | 1 | 1 | 0 | 0 | 0 | 0 | 1 | 1 | 0 | 1 | 0 |
|---|---|---|---|---|---|---|---|---|---|---|---|---|---|---|---|---|---|
| 1 | 0 | 0 | 1 | 1 | 0 | 0 | 1 | 1 | 0 | 1 | 1 | 1 | 1 | 0 | 0 | 0 | 1 |
| 0 | 0 | 0 | 1 | 1 | 0 | 0 | 1 | 1 | 0 | 0 | 0 | 0 | 1 | 1 | 1 | 1 |
| 0 | 1 | 0 | 1 | 1 | 0 | 0 | 1 | 0 | 1 | 1 | 1 | 1 | 0 | 0 | 0 | 0 | 0 |
| 0 | 1 | 0 | 1 | 0 | 1 | 0 | 1 | 1 | 0 | 0 | 0 | 0 | 1 | 1 | 1 | 1 | 0 |
| 0 | 1 | 0 | 1 | 1 | 0 | 1 | 0 | 0 | 1 | 0 | 1 | 1 | 0 | 0 | 0 | 0 | 1 |
| 1 | 0 | 1 | 0 | 0 | 1 | 1 | 0 | 0 | 1 | 1 | 1 | 1 | 1 | 0 | 1 | 1 | 0 |
| 0 | 1 | 1 | 0 | 0 | 1 | 1 | 0 | 1 | 0 | 1 | 1 | 0 | 1 | 1 | 1 | 1 | 1 |
| 0 | 1 | 0 | 1 | 0 | 1 | 1 | 0 | 1 | 0 | 0 | 1 | 0 | 1 | 1 | 1 | 0 | 1 |
| 0 | 0 | 1 | 0 | 1 | 0 | 1 | 0 | 1 | 0 | 0 | 0 | 0 | 0 | 0 | 1 | 0 | 1 |

With this embodiment of selecting circuit according to the invention, when the 5-valued data m is an even number (0, 2, 4), the number of output terminals of the data processing circuit 11a that become H (and hence are selected) out of the output terminals OUT1 and OUT2 and that of output terminals of the data processing circuit 11b that become H (and hence are selected) out of the output terminals OUT3 and OUT4 are equal to each other.

If the 5-valued data m is equal to 0, all the output terminals OUT1 through OUT4 become L (and hence are not selected). If m=2, either OUT1 or OUT2 becomes H while either OUT3 or OUT4 becomes H. If m=4, all the output terminals OUT1 through OUT4 become H (and hence are selected).

With the embodiment of selecting circuit according to the invention, when the 5-valued data m is an odd number (1, 3), the number of output terminals of the data processing circuit 11a that become H (and hence are selected) out of the output terminals OUT1, OUT2 and that of output terminals of the data processing circuit 11b that become H (and hence are selected) out of the output terminals OUT3, OUT3 are not equal to each other.

If the 5-valued data m is equal to 1, there are two possibilities. One is that either OUT1 or OUT2 becomes H and both OUT3 and OUT4 become L and the other is that both OUT1 and OUT2 become L and either OUT3 or OUT4 becomes H. As pointed out earlier, of the group of OUT1 and OUT2 and that of OUT3 and OUT4, the one where both of the output terminals become L is switched in an alternating way each time an odd number m is input.

If m=3, there are also two possibilities. One is that either OUT1 or OUT2 becomes H and both OUT3 and OUT4 become H and the other is that both OUT1 and OUT2 become H and either OUT3 or OUT4 becomes H. In this case again, of the group of OUT1 and OUT2 and that of OUT3 and OUT4, the one where both of the output terminals become H is switched in an alternating way each time an odd number m is input.

In the two data processing circuits 11a, 11b, OUT1 and OUT2 are selected with a same probability on the basis of the input value and the reading of the pointer register (15' in FIG. 5A) and similarly OUT3 and OUT4 are also selected with a same probability.

When the number of selected output terminals is not smaller than 1, the pointer register specifies the position of the output terminal that is selected first. If, for example, the pointer register specifies the register for outputting OUT1 in the data processing circuit 11a and LSB1 and MSB1 of the data indicate that an output terminal is to be selected, the register for outputting OUT1 is selected and OUT1 becomes equal to "1". Thereafter, the output of the pointer register changes to specify the register for outputting OUT2.

If, on the other hand, the pointer register specifies the register for outputting OUT1 in the data processing circuit 11a and LSB1 and MSB1 of the data indicate that two output terminals are to be selected, the register for outputting OUT1 and the register for outputting OUT2 are selected and both OUT1 and OUT2 become equal to "1". Finally, if LSB1 and MSB1 of the data indicate that no output terminal is to be selected, neither the register for outputting OUT1 nor the register for outputting OUT2 are selected and both OUT1 and OUT2 become equal to "0". In either case, the output of the pointer register keeps on specifying the register for outputting OUT1.

With the above arrangement for operations, the four output terminals OUT1, OUT2, OUT3 and OUT4 become H (and hence are selected) with a same and identical probability.

FIG. 6 is a schematic circuit diagram of a D/A converter comprising the selecting circuit of FIGS. 5A and 5B.

The D/A converter employs a multi-bit $\Sigma\Delta$ (sigma delta) modulation method. Note that the output terminals OUT1 through OUT4 in FIGS. 5A and 5B correspond to the output terminals OUT1 through OUT4 in FIG. 6.

The number of inverters that become L (and hence are selected) out of the four inverters Inv. 1, Inv. 2, Inv. 3 and Inv. 4 depends on the 5-valued data m. For instance, if m=0, the outputs of all the four inverters Inv. 1, Inv. 2, Inv. 3 and Inv. 4 become H (and hence are not selected). If, on the other hand, m=1, 2, 3 or 4, the number of outputs that become L out of the four inverters Inv. 1, Inv. 2, Inv. 3 and Inv. 4 will be 1, 2, 3 or 4 respectively.

Table 6 shows the relationship between the 5-valued data m and the outputs of the inverters Inv. 1, Inv. 2, Inv. 3 and Inv. 4 that can be obtained when the selecting circuit of FIGS. 5A and 5B is applied to the D/A converter of FIG. 6. In Table 6, a white circle denotes a selected output (½ duty L output).

TABLE 6

| 7-Values output signal | DATA | PDWA Cording Selected: ○ | | | |
|---|---|---|---|---|---|
| | | 1 | 2 | 3 | 4 |
| +2 | 4 | ○ | ○ | ○ | ○ |
| −1 | 1 | ● | ● | ○ | ● |
| 0 | 2 | ○ | ● | ● | ○ |
| +1 | 3 | ○ | ○ | ○ | ● |
| +2 | 4 | ○ | ○ | ○ | ○ |
| −1 | 1 | ● | ● | ● | ○ |
| −2 | 0 | ● | ● | ● | ● |
| 0 | 2 | ● | ○ | ○ | ● |
| +1 | 3 | ○ | ○ | ● | ○ |
| 0 | 2 | ○ | ● | ○ | ● |
| −2 | 0 | ● | ● | ● | ● |
| 0 | 2 | ● | ○ | ● | ○ |
| −1 | 1 | ● | ● | ○ | ● |
| +2 | 4 | ○ | ○ | ○ | ○ |
| +1 | 3 | ○ | ○ | ● | ○ |

TABLE 6-continued

| | | PDWA Cording Selected: ○ | | | |
|---|---|---|---|---|---|
| 7-Values output signal | DATA | 1 | 2 | 3 | 4 |
| −2 | 0 | ● | ● | ● | ● |
| −1 | 1 | ● | ● | ○ | ● |
| +1 | 3 | ○ | ○ | ● | ○ |
| −2 | 0 | ● | ● | ● | ● |
| 0 | 2 | ○ | ● | ○ | ● |
| −1 | 1 | ● | ● | ● | ○ |
| +2 | 4 | ○ | ○ | ○ | ○ |
| −2 | 0 | ● | ● | ● | ● |
| +1 | 3 | ○ | ○ | ○ | ○ |
| −1 | 1 | ● | ● | ● | ○ |
| 0 | 2 | ● | ○ | ○ | ● |
| +2 | 4 | ○ | ○ | ○ | ○ |
| +1 | 3 | ○ | ○ | ● | ○ |
| 0 | 2 | ○ | ● | ○ | ● |

The selection method of Table 6 will be referred to as PDWA-decoding here.

The PDWA-decoding method is characterized in that the four inverters Inv. 1, Inv. 2, Inv. 3 and Inv. 4 are divided into a first group of two inverters Inv. 1 and Inv. 2 and a second group of two inverters Inv. 3 and Inv. 4 and the selecting circuit is operated in such a way that the two inverters of the first group, or Inv. 1 and Inv. 2, are selected with a same probability, while the two inverters of the second group, or Inv. 3 and Inv. 4, are selected with a same probability. Additionally, the value of the two most significant bits (MSB, 2SB) of the input 3-bit (5-valued) data is halved and the number of inverters equal to the quotient are selected in both the group of the inverters Inv. 1 and Inv. 2 and the group of the inverters Inv. 3 and Inv. 4 in a manner as described earlier.

Still additionally, if the least significant bit (LSB) is equal to 1 and hence the 3-bit (5-valued) data represents an odd number, the inverter selected by the LSB is switched in an alternating way between the group of the inverters Inv. 1 and Inv. 2 and that of the inverters Inv. 3 and Inv. 4.

Then, as a result, the four inverters Inv. 1, Inv. 2, Inv. 3 and Inv. 4 are selected with a same and identical probability and the error (noise) generated by the inverters Inv. 1, Inv. 2, Inv. 3 and Inv. 4 and the resistor R connected thereto can be subjected to a noise-shaping process to move it out of the band. Thus, it is possible to provide a D/A converter showing a high S/N ratio.

Table 7 illustrates the operation of the D/A converter of FIG. 6.

Note that, in Table 7, the operation of D/A conversion is conducted on the basis of the 5-valued data that are obtained by thermometer-decoding but and not subjected to a scrambling process for the purpose of simplification.

TABLE 7

| 5-Values data | INV. 1 | INV. 2 | INV. 3 | INV. 4 | (5) | Injection current |
|---|---|---|---|---|---|---|
| 4 | L' | L' | L' | L' | 2L | −VDD/R |
| 3 | L' | L' | L' | H | 2L | −VDD/2R |
| 2 | L' | L' | H | H | 2L | 0 |
| 1 | L' | H | H | H | 2L | +VDD/2R |
| 0 | H | H | H | H | 2L | +VDD/R |

L' = ½ duty

Figure 7:
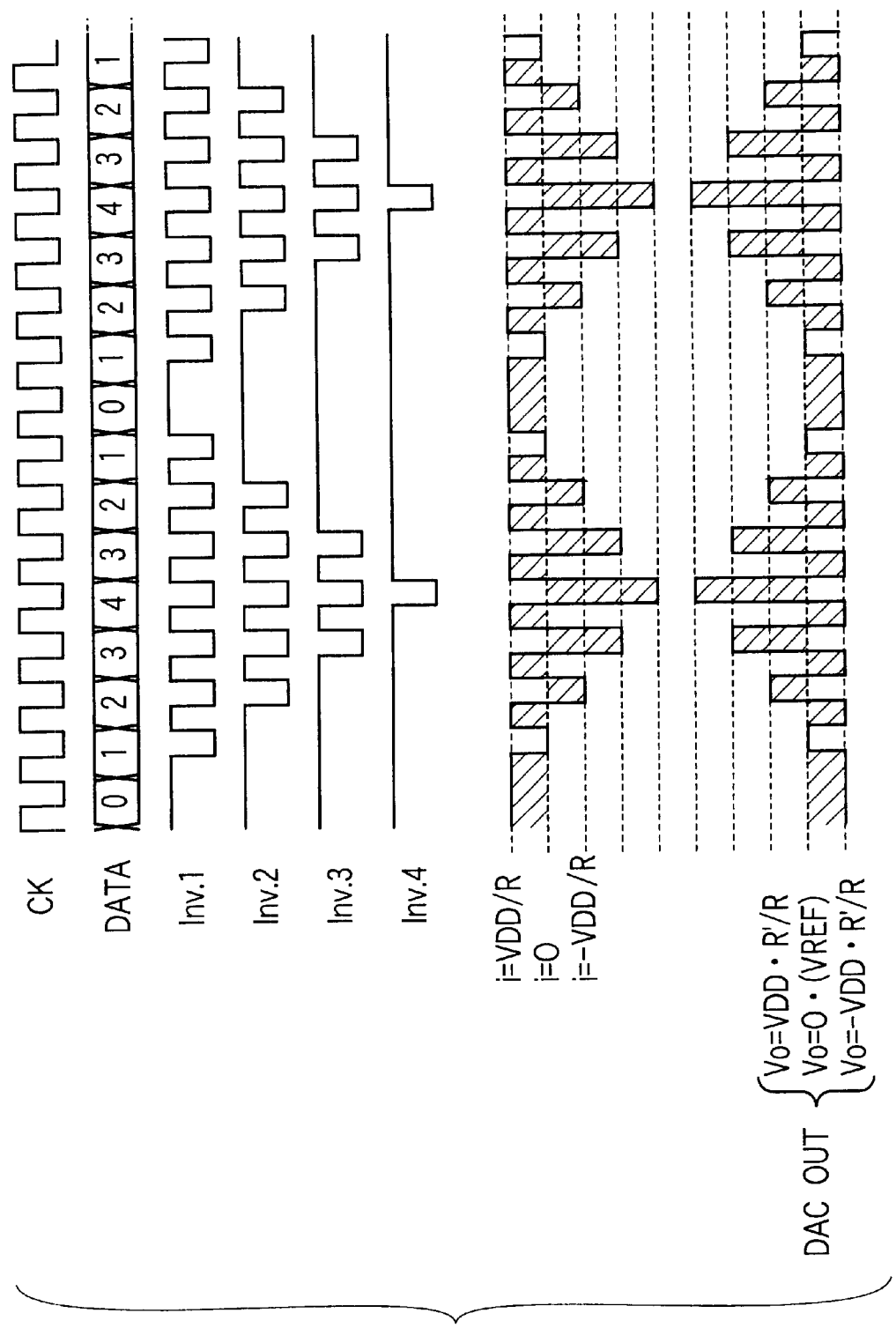
FIG. 7 is a graph illustrating the current waveforms of inverted input signals of the operational amplifier of FIG. 6.

FIG. 7 shows the waveform of the electric current i input to the negative input node of the operational amplifier of FIG. 6 and the waveform of the analog voltage output. Again, the waveform shown there for D/A conversion is obtained on the basis of the 5-valued data that are subjected to thermometer-decoding but not to scrambling for the purpose of simplification. Also note that the low pass filter effect of the feedback capacity of the operational amplifier is also disregarded.

FIG. 8 is a schematic circuit diagram of a multi-bit ΣΔ modulation type A/D converter comprising the selecting circuit of FIGS. 5A and 5B.

The operation of the feedback section (for D/A conversion) of the A/D converter is substantially same as that of the D/A converter of FIG. 6, although a 3-bit (5-valued) data is obtained by subjecting the output of the analog integrator output circuit 20 of the A/D converter section to A/D conversion by means of four analog comparators CMP1, CMP2, CMP3 and CMP4 and a logic circuit 21.

Table 8 illustrates the relationship between the outputs of the comparators and the values obtained by A/D conversion.

TABLE 8

| INT. OUT | CMP1 | CMP2 | CMP3 | CMP4 | MSB | 2SB | LSB | 2's Comp* |
|---|---|---|---|---|---|---|---|---|
| ⑤ | + | + | + | + | 1 | 0 | 0 | 010 |
| ④ | − | + | + | + | 0 | 1 | 1 | 001 |
| ③ | − | − | + | + | 0 | 1 | 0 | 000 |
| ② | − | − | − | + | 0 | 0 | 1 | 111 |
| ① | − | − | − | − | 0 | 0 | 0 | 110 |

Note:
2's comp can be obtained by adding 110 to a natural binary number.

As seen from above, in the case of an A/D converter circuit, the error (noise) generated by the inverters Inv. 1, Inv. 2, Inv. 3 and Inv. 4 and the resistor R connected thereto in the D/A converter circuit of the feedback section can be subjected to a noise-shaping process to move it out of the band. Thus, it is possible for an A/D converter according to the invention to carry out A/D conversions with a high S/N ratio.

Figure 9:
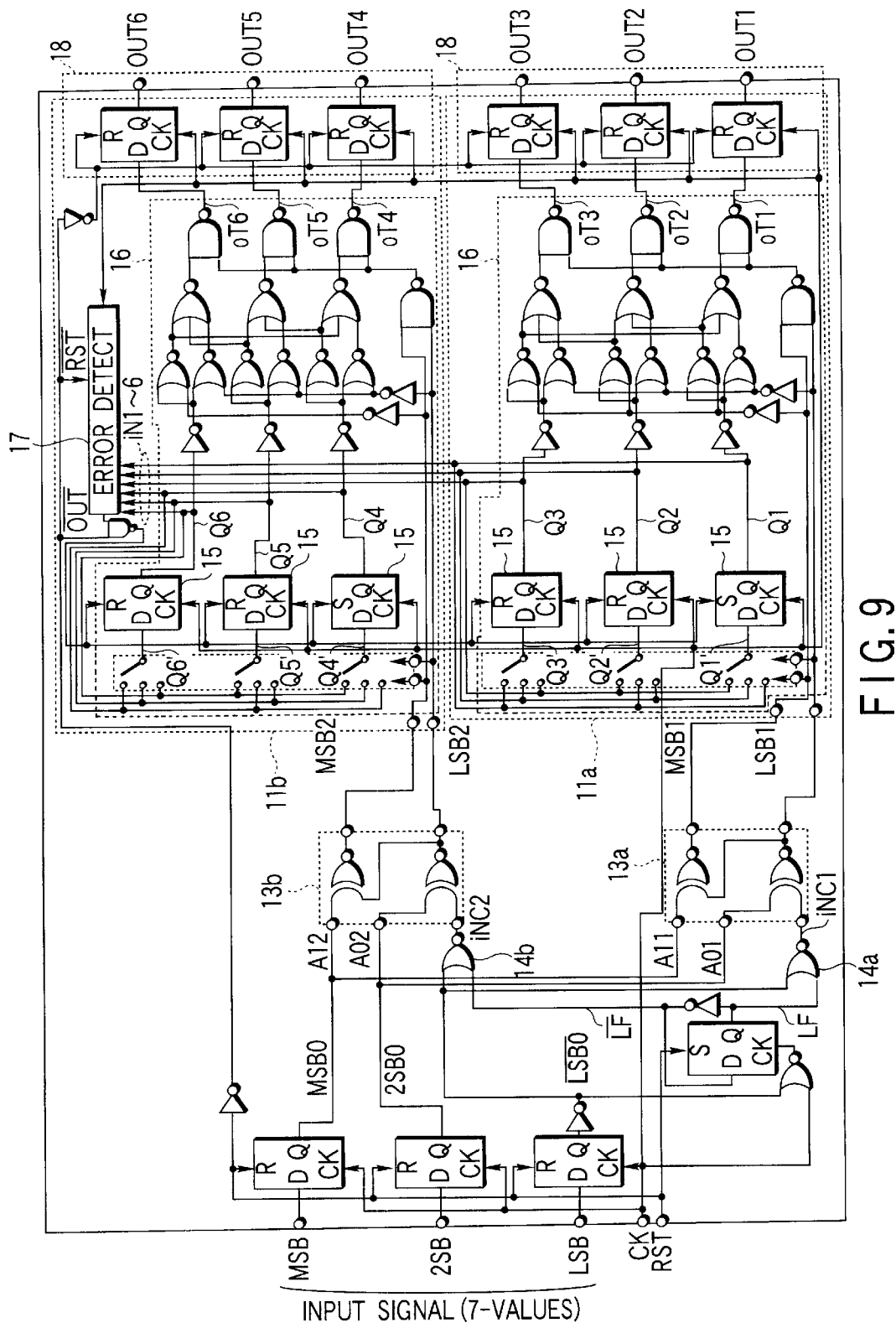
FIG. 9 is a schematic circuit diagram of a second embodiment of selecting circuit according to the invention.
Figure 10:
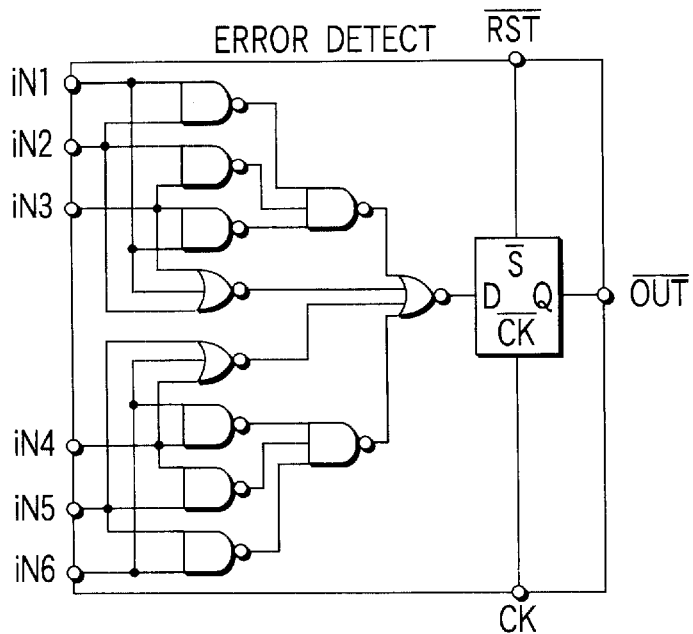
FIG. 10 is a schematic circuit diagram of the error detection circuit of FIG. 9.
Figure 11:
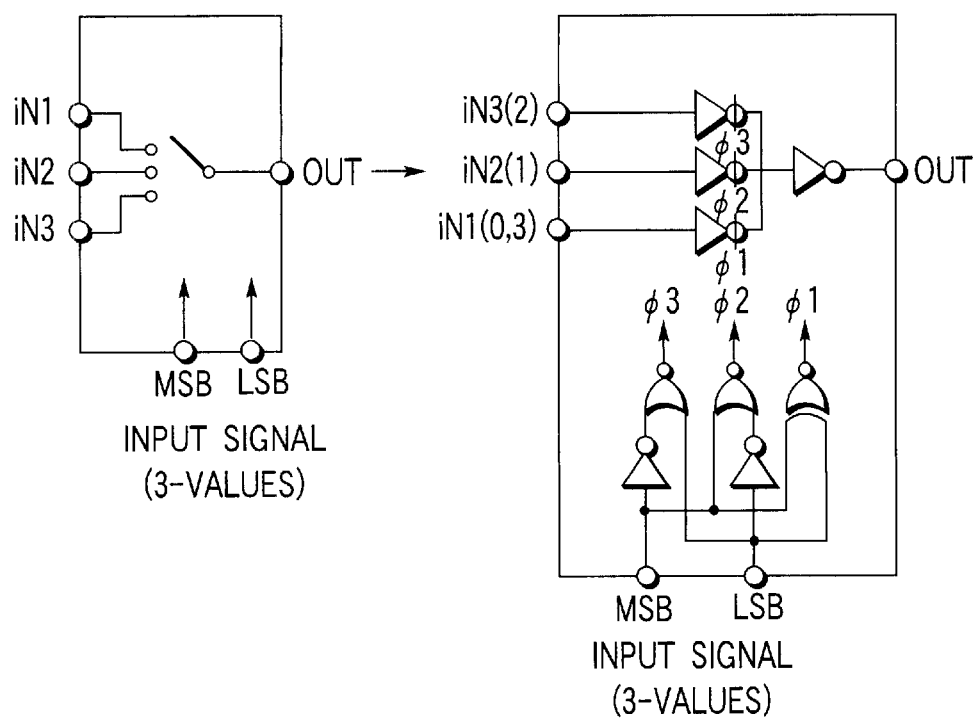
FIG. 11 is a schematic circuit diagram of the switch circuit of FIG. 9.

FIGS. 9 through 11 illustrate a second embodiment of selecting circuit according to the invention.

This embodiment of selecting circuit comprises a pair of data processing circuits 11a, 11b. The data processing circuit 11a is adapted to control outputs OUT1, OUT2 and OUT3 whereas the data processing circuit 11b is adapted to control outputs OUT4, OUT5 and OUT6.

7-valued input data (p=3) are used for this embodiment. Thus, the value m of the input is an integer between 0 and 6 and m is input in the form of a binary number. According to the invention, the value of the two most significant bits (MSB, 2SB) taken out of the three bit data of m is halved so as to be used by the two data processing circuit 11a, 11b.

For example, if MSB=0 and 2SB=1, the value obtained by halving the input value (=1, or 01 in the form of 2-bit binary number), neglecting the least significant bit (LSB), is used for the input to each of the two data processing circuits 11a, 11b.

Additionally, if 1 is to be added to the value of the two most significant bits of the 3-bit data or not is determined according to the value of the LSB.

If LSB=0, the value of the two most significant bits is input to the two data processing circuits 11a, 11b as 2-bit data. This means that m is halved and the quotient is input to each of the circuits.

If, on the other hand, LSB=1, 1 is added to the 2-bit data showing the value of the two most significant bits and the sum is input to either one of the two data processing circuits 11a, 11b while the value of the two most significant bits is input to the other circuit. This means that (m+1)/2 is input to the former circuit because 1 is added to the value of the two most significant bits, whereas (m−1)/2 is input to the latter circuit because 1 is not added to the value of the two most significant bits and the LSB is neglected.

The sum of the two input values is equal to m. As pointed out above, the sum of the two values entered respectively to the two data processing circuits 11a, 11b is equal to the value of the input signal m. Then, each of the two data processing circuits 11a, 11b selects a number of output terminals that corresponds to the value input to it. As a result, a number of output terminals that corresponds to the input signal m will be selected.

Tables 9 and 10 are truth tables for the sequence of operation of the selecting circuit of FIGS. 9 through 11.

With this embodiment of selecting circuit according to the invention, when the 7-valued data m is an even number (0, 2, 4, 6), the number of output terminals of the data processing circuit 11a that become H (and hence are selected) out of the output terminals OUT1, OUT2, OUT3 and that of output terminals of the data processing circuit 11b that become H (and hence are selected) out of the output terminals OUT4, OUT5, OUT6 are equal to each other. If the 7-valued data m is equal to 0, all the output terminals OUT1 through OUT6 become L (and hence are not selected). If m=2, one of OUT1, OUT2 and OUT3 becomes H while one of OUT4, OUT5 and OUT6 becomes H. If m=4, two of OUT1, OUT2 and OUT3 become H while two OUT4, OUT5 and OUT6 become H. If m=6, all the output terminals OUT1 through OUT6 become H (and hence are selected).

With the embodiment of selecting circuit according to the invention, when the 7-valued data m is an odd number (1, 3, 5), the number of output terminals of the data processing circuit 11a that become H (and hence are selected) out of the output terminals OUT1, OUT2 and OUT3 and that of output terminals of the data processing circuit 11b that become H (and hence are selected) output of the output terminals OUT4, OUT5 and OUT6 are not equal to each other.

If the 7-valued data m is equal to 1, there are two possibilities. One is that one of OUT1, OUT2 and OUT3 becomes H and all of OUT4, OUT5 and OUT6 become L and the other is that all of OUT1, OUT2 and OUT3 become L and one of OUT4, OUT5 and OUT6 becomes H. As pointed out earlier, of the group of OUT1, OUT2 and OUT3 and that of OUT4, OUT5 and OUT6, the one where all the output terminals become L is switched in an alternating way each time an odd number m is input.

If m=3, there are also two possibilities. One is that one of OUT1, OUT2 and OUT3 becomes H and two of OUT4, OUT5 and OUT6 become H and the other is that two of OUT1, OUT2 and OUT3 become H and one of OUT4, OUT5 and OUT6 becomes H. In this case again, of the group of OUT1, OUT2 and OUT3 and that of OUT4, OUT5 and OUT6, the one where both of the output terminals become L is switched in an alternating way each time an odd number m is input.

If m=5, there are also two possibilities. One is that two of OUT1, OUT2 and OUT3 become H and all of OUT4, OUT5 and OUT6 become H and the other is that all of OUT1, OUT2 and OUT3 become H and two of OUT4, OUT5 and OUT6 become H. Once again, of the group of OUT1, OUT2 and OUT3 and that of OUT4, OUT5 and OUT6, the one where all the output terminals become H is switched in an alternating way each time an odd number m is input.

TABLE 9

| 7-Values data | MSB | 2SB | LSB | LF | MSB2 | LSB2 | MSB1 | LSB1 |
|---|---|---|---|---|---|---|---|---|
| 0 | 0 | 0 | 1 | 0 | 0 | 0 | 0 | 0 |
| 0 | 0 | 0 | 1 | 1 | 0 | 0 | 0 | 0 |
| 1 | 0 | 1 | 0 | 0 | 0 | 1 | 0 | 0 |
| 1 | 0 | 1 | 0 | 1 | 0 | 0 | 0 | 1 |
| 2 | 0 | 1 | 1 | 0 | 0 | 1 | 0 | 1 |
| 2 | 0 | 1 | 1 | 1 | 0 | 1 | 0 | 1 |
| 3 | 1 | 0 | 0 | 0 | 1 | 0 | 0 | 1 |
| 3 | 1 | 0 | 0 | 1 | 0 | 1 | 1 | 0 |
| 4 | 1 | 0 | 1 | 0 | 1 | 0 | 1 | 0 |
| 4 | 1 | 0 | 1 | 1 | 1 | 0 | 1 | 0 |
| 5 | 1 | 1 | 0 | 0 | 1 | 1 | 1 | 0 |
| 5 | 1 | 1 | 0 | 1 | 1 | 0 | 1 | 1 |
| 6 | 1 | 1 | 1 | 0 | 1 | 1 | 1 | 1 |
| 6 | 1 | 1 | 1 | 1 | 1 | 1 | 1 | 1 |

TABLE 10

| 7-Values data/2 | RST | MSB1(2) | LSB1(2) | POINTER | | | | | | OUTPUT | | |
|---|---|---|---|---|---|---|---|---|---|---|---|---|
| | | | | Q1(4) | Q2(5) | Q3(6) | Q1'(4') | Q2'(5') | Q3'(6') | oT1(4) | oT2(5) | oT3(6) |
| — | 1 | 0 | 0 | 1 | 0 | 0 | 1 | 0 | 0 | 0 | 0 | 0 |
| 0 | 0 | 0 | 0 | 1 | 0 | 0 | 1 | 0 | 0 | 0 | 0 | 0 |
| 0 | 0 | 0 | 0 | 0 | 1 | 0 | 0 | 1 | 0 | 0 | 0 | 0 |
| 0 | 0 | 0 | 0 | 0 | 0 | 1 | 0 | 0 | 1 | 0 | 0 | 0 |
| 1 | 0 | 0 | 1 | 1 | 0 | 0 | 0 | 1 | 0 | 1 | 0 | 0 |
| 1 | 0 | 0 | 1 | 0 | 1 | 0 | 0 | 0 | 1 | 0 | 1 | 0 |
| 1 | 0 | 0 | 1 | 0 | 0 | 1 | 1 | 0 | 0 | 0 | 0 | 1 |
| 2 | 0 | 1 | 0 | 1 | 0 | 0 | 0 | 1 | 1 | 1 | 1 | 0 |
| 2 | 0 | 1 | 0 | 0 | 1 | 0 | 1 | 0 | 0 | 0 | 1 | 1 |
| 2 | 0 | 1 | 0 | 0 | 0 | 1 | 0 | 1 | 0 | 1 | 0 | 1 |
| 3 | 0 | 1 | 1 | 1 | 0 | 0 | 1 | 0 | 0 | 1 | 1 | 1 |
| 3 | 0 | 1 | 1 | 0 | 1 | 0 | 0 | 1 | 0 | 1 | 1 | 1 |
| 3 | 0 | 1 | 1 | 0 | 0 | 1 | 0 | 0 | 1 | 1 | 1 | 1 |

In the data processing circuit 11a, OUT1, OUT2 and OUT3 are selected with a same probability on the basis of the input value and the reading of the pointer register (D-FF outputting Q1, Q2 and Q3 in FIG. 9). In the data processing circuit 11b, OUT4, OUT5 and OUT6 are selected with a same probability on the basis of the input value and the reading of the pointer register (D-FF outputting Q4, Q5 and Q6 in FIG. 9).

When the number of selected output terminals is not smaller than 1, the pointer register specifies the position of the output terminal that is selected first.

If, for example, the pointer register specifies the register for outputting OUT1 in the data processing circuit 11a and LSB1 and MSB1 of the data indicate that an output terminal is to be selected, the register for outputting OUT1 is selected and OUT1 becomes equal to "1". Thereafter, the output of the pointer register changes to specify the register for outputting OUT2.

If the pointer register specifies the register for outputting OUT2 and LSB1 and MSB1 of the data indicate that an output terminal is to be selected, the register for outputting OUT2 is selected and OUT2 becomes equal to "1". Thereafter, the output of the pointer register changes to specify the register for outputting OUT3.

If the pointer register specifies the register for outputting OUT3 and LSB1 and MSB1 of the data indicate that an output terminal is to be selected, the register for outputting OUT3 is selected and OUT3 becomes equal to "1". Thereafter, the output of the pointer register changes to specify the register for outputting OUT1.

If, on the other hand, the pointer register specifies the register for outputting OUT1 in the data processing circuit 11a and LSB1 and MSB1 of the data indicate that two output terminals are to be selected, the register for outputting OUT1 and the register for outputting OUT2 are selected and both OUT1 and OUT2 become equal to "1". Thereafter, the output of the pointer register changes to specify the register for outputting OUT3.

Finally, if the pointer register specifies the register for outputting OUT1 and LSB1 and MSB1 of the data indicate that no output terminal is to be selected, none of the three registers are selected and all of OUT1, OUT2 and OUT3 become equal to "0". In either case, the output of the pointer register keeps on specifying the register for outputting OUT1.

With the above arrangement for operations, the six output terminals OUT1, OUT2, OUT3, OUT4, OUT5 and OUT6 become H (and hence are selected) with a same and identical probability.

In the selecting circuit of FIGS. 9 through 11, if an error of operation arises due to, for example, a very large noise or an unstable operation of the power supply VDD, error detection circuit ERROR-DETECT becomes active to bring the selecting circuit back to the normal state or operation.

Figure 12:
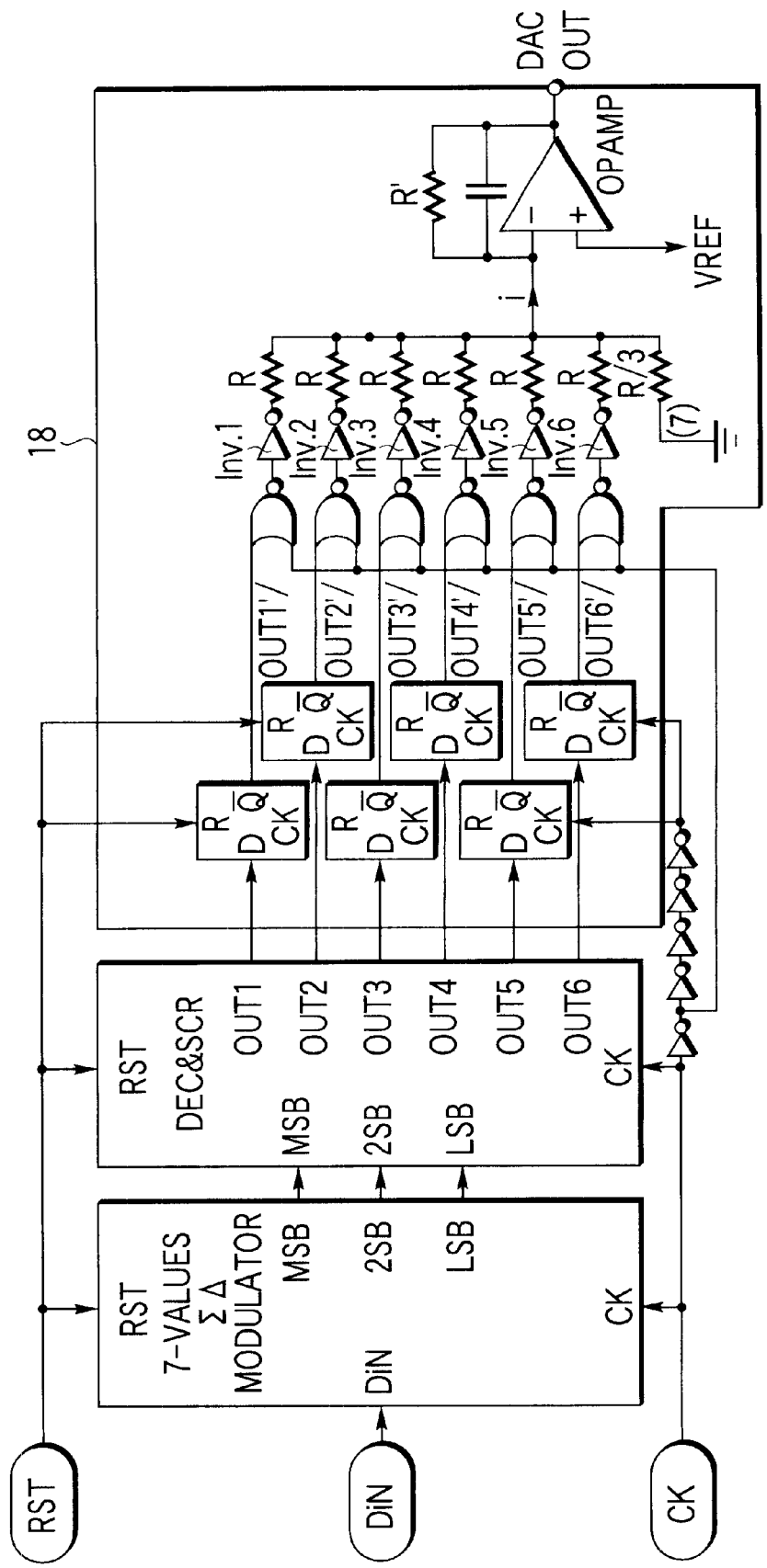
FIG. 12 is a D/A converter comprising the selecting circuit of FIGS. 9 through 11.

FIG. 12 is a D/A converter comprising the selecting circuit of FIGS. 9 through 11.

The D/A converter employs a multi-bit ΣΔ (sigma delta) modulation method. Note that the output terminals OUT1 through OUT6 in FIGS. 9 through 11 correspond to the output terminals OUT1 through OUT6 in FIG. 12.

The number of inverters that become L (and hence are selected) out of the six inverters Inv. 1, Inv. 2, Inv. 3, Inv. 4, Inv. 5 and Inv. 6 depends on the 7-valued data m. For instance, if m=0, the outputs of all the six inverters Inv. 1, Inv. 2, Inv. 3, Inv. 4, Inv. 5 and Inv. 6 become H (and hence are not selected). If, on the other hand, m=1, 2, 3, 4, 5 or 6, the number of outputs that become L out of the six inverters Inv. 1, Inv. 2, Inv. 3, Inv. 4, Inv. 5 and Inv. 6 will be 1, 2, 3, 4, 5 or 6 respectively.

Table 11 shows the relationship between the 7-valued data and the outputs of the inverters Inv. 1, Inv. 2, Inv. 3, Inv. 4, Inv. 5 and Inv. 6 that can be obtained when the selecting circuit of FIGS. 9 through 11 is applied to the D/A converter of FIG. 12. In Table 11, a white circle denotes a selected output (½ duty L output).

TABLE 11

| 7 Values | | PDWA Cording Selected: o | | | | | |
|---|---|---|---|---|---|---|---|
| output signal | DATA | 1 | 2 | 3 | 4 | 5 | 6 |
| +2 | 5 | o | o | • | o | o | o |
| -1 | 2 | • | • | o | o | • | • |
| 0 | 3 | o | o | • | • | o | • |
| +1 | 4 | o | • | o | o | • | o |
| +3 | 6 | o | o | o | o | o | o |
| +2 | 5 | • | o | o | o | o | o |
| -2 | 1 | o | • | • | • | • | • |
| 0 | 3 | • | o | • | • | o | o |
| +1 | 4 | o | • | o | o | o | • |
| -3 | 0 | • | • | • | • | • | • |
| -2 | 1 | • | o | • | • | • | • |
| 0 | 3 | • | • | o | o | • | o |
| -1 | 2 | o | • | • | • | o | • |
| +3 | 6 | o | o | o | o | o | o |
| +2 | 5 | o | o | o | o | • | o |
| -2 | 1 | • | o | • | • | • | • |
| -1 | 2 | • | o | • | o | o | • |
| +1 | 4 | o | • | o | o | o | • |
| -2 | 1 | • | o | • | • | • | • |
| 0 | 3 | • | • | o | o | • | o |
| -1 | 2 | o | • | • | • | o | • |
| +3 | 6 | o | o | o | o | o | o |
| -3 | 0 | • | • | • | • | • | • |
| +2 | 5 | o | o | o | o | • | o |
| -1 | 2 | • | o | • | • | o | • |
| -3 | 0 | • | • | • | • | • | • |
| +3 | 6 | o | o | o | o | o | o |
| +2 | 5 | o | • | o | o | o | o |
| 0 | 3 | • | o | o | • | • | o |
| -3 | 0 | • | • | • | • | • | • |
| +1 | 4 | o | o | • | o | o | • |

As mentioned earlier, the selection method of Table 11 will be referred to as PDWA-decoding here.

The PDWA-decoding method is characterized in that the six inverters Inv. 1, Inv. 2, Inv. 3, Inv. 4, Inv. 5 and Inv. 6 are divided into a first group of three inverters Inv. 1, Inv. 2 and Inv. 3 and a second group of three inverters Inv. 4, Inv. 5 and Inv. 6 and the selecting circuit is operated in such a way that the three inverters of the first group, or Inv. 1, Inv. 2 and Inv. 3, are selected with a same probability, while the three inverters of the second group, or Inv. 4, Inv. 5 and Inv. 6, are selected with a same probability. Additionally, the value of the two most significant bits (MSB, 2SB) of the input 3-bit (7-valued) data is halved and the number of inverters equal to the quotient are selected in both the group of the inverters Inv. 1, Inv. 2 and Inv. 3 and the group of the inverters Inv. 4, Inv. 5 and Inv. 6 in a manner as described earlier.

Still additionally, if the least significant bit (LSB) is equal to 1 and hence the 3-bit (7-valued) data represents an odd number, the inverter selected by the LSB is switched in an alternating way between the group of the inverters Inv. 1, Inv. 2 and Inv. 3 and that of the inverters Inv. 4, Inv. 5 and Inv. 6.

Then, as a result, the six inverters Inv. 1, Inv. 2, Inv. 3, Inv. 4, Inv. 5 and Inv. 6 are selected with a same and identical probability and the error (noise) generated by the inverters Inv. 1, Inv. 2, Inv. 3, Inv. 4, Inv. 5 and Inv. 6 and the resistor R connected thereto can be subjected to a noise-shaping process to move it out of the band. Thus, it is possible to provide a D/A converter showing a high S/N ratio.

Table 12 illustrates the operation of the D/A converter of FIG. 12. Note that, in Table 12, the operation of D/A conversion is conducted on the basis of the 7-valued data that are obtained by thermometer-decoding but and not subjected to a scrambling process for the purpose of simplification.

TABLE 12

| 7-Values output signal | DATA | INV. 1 | INV. 2 | INV. 3 | INV. 4 | INV. 5 | INV. 6 | (7) | Implanted current |
|---|---|---|---|---|---|---|---|---|---|
| +3 | 6 | L' | L' | L' | L' | L' | L' | 3L | −3VDD/2R |
| +2 | 5 | L' | L' | L' | L' | L' | H  | 3L | −2VDD/2R |
| +1 | 4 | L' | L' | L' | L' | H  | H  | 3L | −VDD/2R |
|  0 | 3 | L' | L' | L' | H  | H  | H  | 3L | 0 |
| −1 | 2 | L' | L' | H  | H  | H  | H  | 3L | +VDD/2R |
| −2 | 1 | L' | H  | H  | H  | H  | H  | 3L | +2VDD/2R |
| −3 | 0 | H  | H  | H  | H  | H  | H  | 3L | +3VDD/2R |

L' = ½ duty

Figure 13:
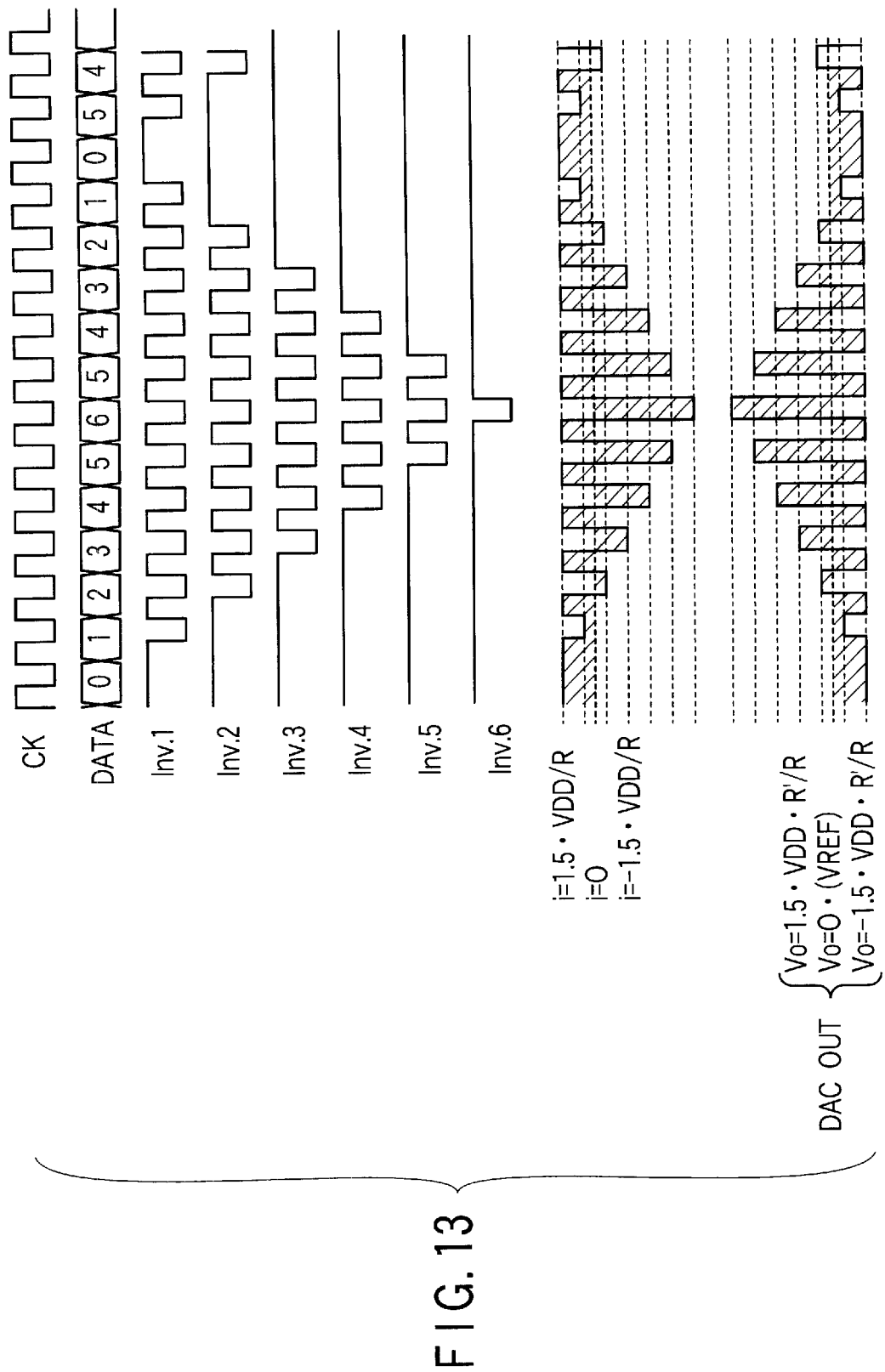
FIG. 13 is a graph illustrating the current waveforms of inverted input signals of the operational amplifier of FIG. 12.

FIG. 13 shows the waveform of the electric current i input to the negative input node of the operational amplifier of FIG. 12 and the waveform of the analog voltage output.

Again, the waveform shown there for D/A conversion is obtained on the basis of the 7-valued data that are subjected to thermometer-decoding but not to scrambling for the purpose of simplification. Also note that the low pass filter effect of the feedback capacity of the operational amplifier is also disregarded.

A selecting circuit according to the invention and a D/A converter (or an A/D converter) comprising such a selecting circuit are described above. Now, the noise-shaping effect of a selecting circuit according to the invention will be simulated.

Figure 14:
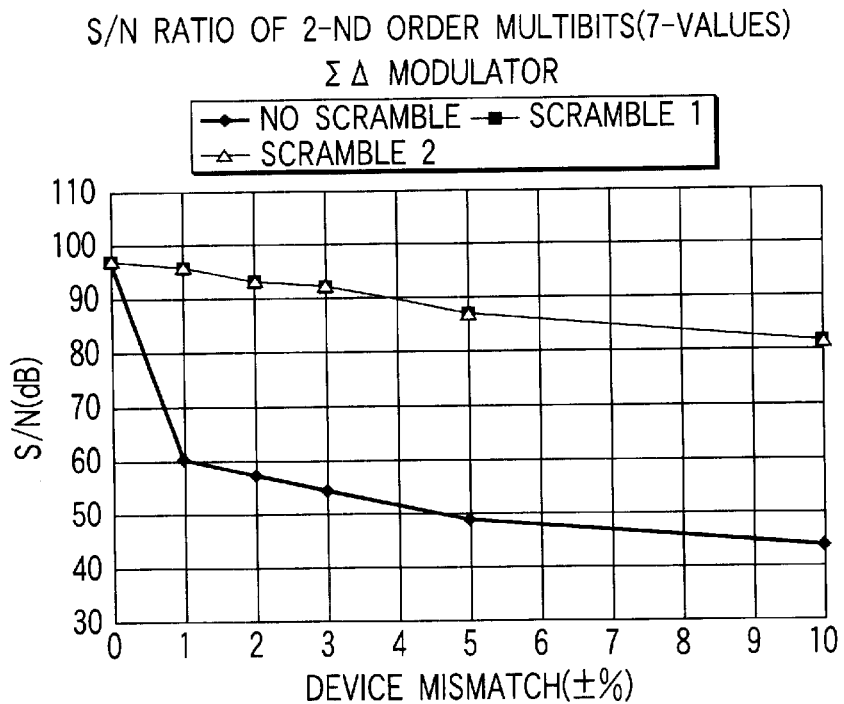
FIG. 14 is a graph illustrating the relationship between the inter-element error and the S/N value for comparison between the prior art and the present invention.
Figure 15:
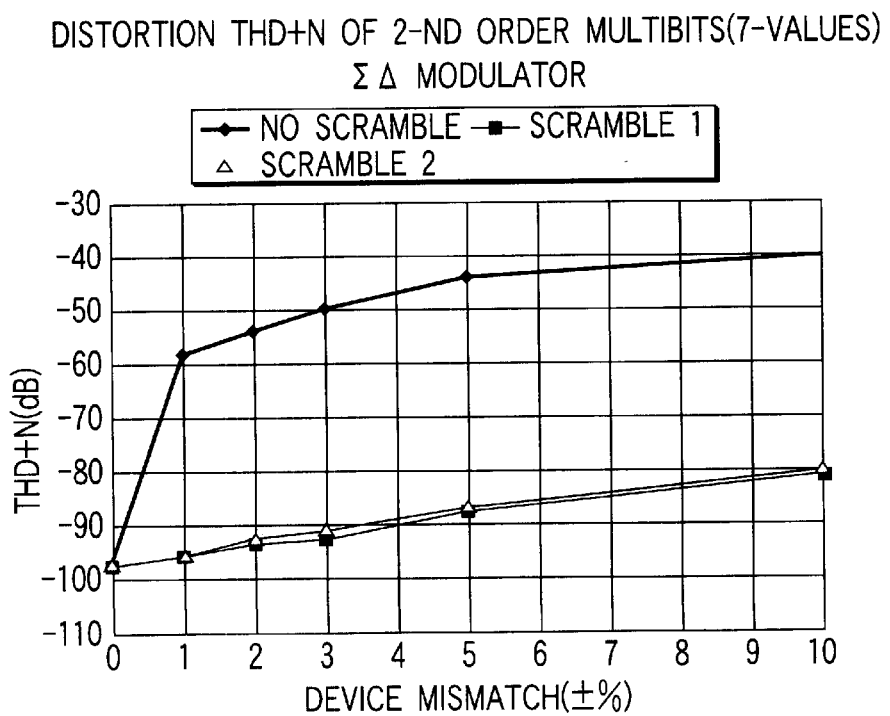
FIG. 15 is a graph illustrating the relationship between the device mismatch and the distortion value for comparison between the prior art and the present invention.

FIGS. 14 and 15 are graphs illustrating some of the results obtained by a simulation of the noise-shaping effect of a selecting circuit according to the invention.

The graphs of FIGS. 14 and 15 are obtained by applying a selecting circuit according to the invention to a ΣΔ modulator adapted to produce 7-valued outputs. In FIGS. 14 and 15, no scramble refers to known thermometer-decoding and scramble 1 refers to known DWA-decoding, whereas scramble 2 refers to PDWA-decoding according to the invention.

Referring to FIG. 14, the horizontal axis represents the device mismatch and the vertical axis represents the S/N value. The result of the simulation shown in FIG. 14 reveals the following.

When no scramble is used, the S/N value falls rapidly to 60 dB when there exists a device mismatch of 1%. Then, the S/N value falls further as the device mismatch increases. For example, the S/N value is about 40 dB when the device mismatch is 10%.

Normally, there exists a device mismatch of about several percents to be conservative. Therefore, any known product where no scramble is used does not operate well and hence can poorly find practical applications.

On the other hand, with scramble 1 and scramble 2, the S/N value for a device mismatch of 1% is lower than the value for a device mismatch of 0% only by about 1dB and falls only by about 15dB when the device mismatch rises to 10%. Thus, the S/N value never falls below 80dB.

Thus, by using a selecting circuit (or a rearrangement algorithm) according to the invention, a satisfactorily large S/N value can be obtained as in the case of DWA-decoding without remarkably increasing the size of the hardware so that it is possible to highly accurately carry out D/A conversions.

Referring to FIG. 15, the horizontal axis represents the device mismatch and the vertical axis represents the distortion value THD+N. The result of the simulation shown in FIG. 15 reveals the following.

When no scramble is used, the THD+N value is reduced to about −55 dB when there exists a device mismatch of 1%. Then, the THD+N value is reduced further as the device mismatch increases. For example, the THD+N value is about −40 dB when the inter-element error is 10%.

On the other hand, with scramble 1 and scramble 2, the THD+N value for a device mismatch of 1% is reduced from the value for a device mismatch of 0% only by about 1 dB and is worsened only by about 17 dB when the device mismatch rises to 10%. Thus, the THD+N value never rises above −80 dB.

Thus, by using a selecting circuit (or a rearrangement algorithm) according to the invention, a satisfactory THD+N value can be obtained as in the case of DWA-decoding without remarkably increasing the size of the hardware so that it is possible to highly accurately carry out D/A conversions.

As described in detail, in a selecting circuit according to the invention and a D/A converter (or an A/D converter) comprising such a selecting circuit do not involve the use of bulky hardware and the influence of the analog elements on the conversion accuracy can be minimized. Therefore, it is possible to accurately carry out conversions without raising the operating speed. Additionally, since the influence of a device mismatch is minimal, it is no longer necessary to use high precision analog elements and hence the use of a costly manufacturing process and costly techniques such as a trimming technique can be eliminated to reduce the manufacturing cost. Finally, a reduced operating speed by turn reduces the power consumption rate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A selecting circuit comprising:
   a logic circuit adapted to receive an n-bit (2p+1)-valued ($2^n \geq 2p \geq 2$, n and p being an integer) input signal m (m being an integer satisfying the requirement of $2p \geq m \geq 0$), generate a pair of internal signals having a value produced by halving the value obtained on the basis of the upper (n−1) bits of the input signal m, neglecting the least significant bit of said input signal m, and then, in the case of an input signal m having an odd number value, generate first and second signals by alternately adding 1 to said two internal signals for each input of signal m having an odd number value;

a first signal processing circuit having p first output terminals and adapted to select a number of output terminals corresponding to the value of said first signal out of said p first output terminals on the basis of said first signal so as to make said p output terminals to be selected with a same and identical probability of selection; and a second signal processing circuit having p second output terminals and adapted to select a number of output terminals corresponding to the value of said second signal out of said p second output terminals on the basis of said second signal so as to make said p output terminals to be selected with a same and identical probability of selection.

2. The selecting circuit according to claim 1:

wherein the number of the selected output terminals of said first output terminals and said second output terminals is determined by the value of said input signal m.

3. The selecting circuit according to claim 1:

wherein said logic circuit includes a first circuit adapted to generate said pair of internal signals for an input signal m by halving the value obtained by neglecting the least significant bit of said input signal m; and a second circuit adapted to output said two internal signals for each input signal m having the value of an even number but add 1 to either of said pair of internal signals in an alternating way for each input signal having the value of an odd number.

4. The selecting circuit according to claim 1:

wherein said input signal m is expressed in the form of a binary number.

5. The selecting circuit according to claim 1:

wherein each of said first and second signal processing circuits has p registers and first and second pointer circuits adapted to specify only one of said p registers.

6. The selecting circuit according to claim 5:

wherein said first pointer circuit determines the register to be specified by it on the basis of the position of the register currently specified out of said p registers and the value of said first signal.

7. The selecting circuit according to claim 5:

wherein said second pointer circuit determines the register to be specified by it on the basis of the position of the register currently specified out of said p registers and the value of said second signal.

8. The selecting circuit according to claim 6:

wherein said first pointer circuit keeps on specifying the currently specified register for a first signal having a value or 0 or p but specifies a register other than the currently specified one for a first signal having a value between 1 through p−1.

9. The selecting circuit according to claim 7:

wherein said first pointer circuit keeps on specifying the currently specified register for a second signal having a value or 0 or p but specifies a register other than the currently specified one for a second signal having a value between 1 through p−1.

10. The selecting circuit according to claim 8:

wherein said first pointer circuit operates so as not to specify a same register for a first signal repeatedly having a same value.

11. The selecting circuit according to claim 9:

wherein said second pointer circuit operates so as not to specify a same register for a second signal repeatedly having a same value.

12. The selecting circuit according to claim 10:

wherein a single register is arranged in said first pointer circuit and the next output value of said first register is specified on the basis of the current output value of said single register and the value of the first signal for a value of p equal to 2.

13. The selecting circuit according to claim 11:

wherein a single register is arranged in said second pointer circuit and the next value of said first register is specified on the basis of the current output value of said single register and the value of the second signal for a value of p equal to 2.

14. The selecting circuit according to claim 10:

wherein said first pointer circuit selects not fewer than 0 but not more than p terminals out of said p first output terminals on the basis of the position of the currently specified register and the value of said first signal.

15. The selecting circuit according to claim 11:

wherein said second pointer circuit selects not fewer than 0 but not more than p terminals out of said p second output terminals on the basis of the position of the currently specified register and the value of said second signal.

16. The selecting circuit according to claim 14:

wherein the output signal of the terminal selected out of said p first output terminals in said first signal processing circuit is made equal to 1.

17. The selecting circuit according to claim 15:

wherein the output signal of the terminal selected out of said p second output terminals in said second signal processing circuit is made equal to 1.

18. The selecting circuit according to claim 16:

further comprising an error detection circuit adapted to detect any number of registers) other than 1 selected out of said p registers in said first signal processing circuit and forcibly make the number of selected register equal to 1.

19. The selecting circuit according to claim 17:

further comprising an error detection circuit adapted to detect any number of register(s) other than 1 selected out of said p registers in said second signal processing circuit and forcibly make the number of selected register equal to 1.

20. A digital/analog converter comprising:

a selecting circuit having a logic circuit, a first signal processing circuit and a second signal processing circuit;

said logic circuit being adapted to receive an n-bit (2p+1)-valued ($2^n \geq 2p \geq 2$, n and p being an integer) input signal m (m being an integer satisfying the requirement of $2p \geq m \geq 0$), generate a pair of internal signals having a value produced by halving the value obtained on the basis of the upper (n−1) bits of the input signal m, neglecting the least significant bit of said input signal m, and then, in the case of an input signal m having an odd number value, generate first and second signals by alternately adding 1 to said two internal signals for each input of signal m having an odd number value;

said first signal processing circuit having p first output terminals and adapted to select a number of output terminals corresponding to the value of said first signal out of said p first output terminals on the basis of said first signal so as to make said p output terminals to be selected with a same and identical probability of selection;

said second signal processing circuit having p second output terminals and adapted to select a number of output terminals corresponding to the value of said second signal out of said p second output terminals on the basis of said second signal so as to make said p output terminals to be selected with a same and identical probability of selection; and a signal generation circuit for generating an analog signal on the basis of the number output terminals selected out of said first output terminals and said second output terminals by said selecting circuit.

21. An analog/digital converter comprising:

an A/D converter section for converting the analog signal input to the input section into a digital signal; and a feedback section for converting said digital signal into an analog signal and feeding it back to said input section;

said feedback section including:

a selecting circuit having a logic circuit, a first signal processing circuit and a second signal processing circuit;

said logic circuit being adapted to receive an n-bit (2p+1)-valued ($2^n \geq 2p \geq 2$, n and p being an integer) input signal m (m being an integer satisfying the requirement of $2p \geq m \geq 0$), generate a pair of internal signals having a value produced by halving the value obtained on the basis of the upper (n−1) bits of the input signal m, neglecting the least significant bit of said input signal m, and then, in the case of an input signal m having an odd number value, generate first and second signals by alternately adding 1 to said two internal signals for each input of signal m having an odd number value;

said first signal processing circuit having p first output terminals and adapted to select a number of output terminals corresponding to the value of said first signal out of said p first output terminals on the basis of said first signal so as to make said p output terminals to be selected with a same and identical probability of selection;

said second signal processing circuit having p second output terminals and adapted to select a number of output terminals corresponding to the value of said second signal out of said p second output terminals on the basis of said second signal so as to make said p output terminals to be selected with a same and identical probability of selection; and a signal generation circuit for generating an analog signal on the basis of the number output terminals selected out of said first output terminals and said second output terminals by said selecting circuit.

* * * * *